(12) United States Patent
Aoki et al.

(10) Patent No.: US 7,632,740 B2
(45) Date of Patent: Dec. 15, 2009

(54) LAYER HAVING FUNCTIONALITY, METHOD FOR FORMING FLEXIBLE SUBSTRATE HAVING THE SAME, AND METHOD FOR MANUFACTURING SEMICONDUCTOR DEVICE

(75) Inventors: Tomoyuki Aoki, Atsugi (JP); Takuya Tsurume, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 391 days.

(21) Appl. No.: 11/592,249

(22) Filed: Nov. 3, 2006

(65) Prior Publication Data

US 2007/0111391 A1 May 17, 2007

(30) Foreign Application Priority Data

Nov. 11, 2005 (JP) .............................. 2005-327951

(51) Int. Cl.
| | |
|---|---|
| H01L 21/46 | (2006.01) |
| H01L 21/469 | (2006.01) |
| H01L 21/31 | (2006.01) |
| H01L 21/84 | (2006.01) |
| H01L 21/205 | (2006.01) |
| H01L 21/331 | (2006.01) |
| H01L 21/336 | (2006.01) |

(52) U.S. Cl. .................. 438/458; 438/759; 438/149; 257/E21.372; 257/E21.104; 257/E21.411

(58) Field of Classification Search .............. 438/458, 438/759, 149; 257/E21.372, E21.104, E21.411
See application file for complete search history.

(56) References Cited

U.S. PATENT DOCUMENTS 5,821,138 A 10/1998 Yamazaki et al.
(Continued)

FOREIGN PATENT DOCUMENTS

JP 07-157727 6/1995
(Continued)

OTHER PUBLICATIONS

International Search Report (Application No. PCT/JP2006/321928) Dated Feb. 6, 2007.
(Continued)

*Primary Examiner*—Luan C Thai
(74) *Attorney, Agent, or Firm*—Eric J. Robinson; Robinson Intellectual Property Law Office, P.C.

(57) ABSTRACT

It is an object of the present invention to provide a method for forming a layer having functionality including a conductive layer and a colored layer and a flexible substrate having a layer having functionality with a high yield. Further, it is an object of the present invention to provide a method for manufacturing a semiconductor device that is small-sized, thin, and lightweight. After coating a substrate having heat resistance with a silane coupling agent, a layer having functionality is formed. Then, after attaching an adhesive to the layer having functionality, the layer having functionality is peeled from the substrate. Further, after coating a substrate having heat resistance with a silane coupling agent, a layer having functionality is formed. Then, an adhesive is attached to the layer having functionality. Thereafter, the layer having functionality is peeled from the substrate, and a flexible substrate is attached to the layer having functionality.

16 Claims, 18 Drawing Sheets

U.S. PATENT DOCUMENTS

| | | |
|---|---|---|
| 5,834,327 A | 11/1998 | Yamazaki et al. |
| 6,376,333 B1 | 4/2002 | Yamazaki et al. |
| 6,866,949 B2 | 3/2005 | Ota et al. |
| 6,998,282 B1 | 2/2006 | Yamazaki et al. |
| 7,189,631 B2 * | 3/2007 | Yamazaki et al. ........... 438/458 |

FOREIGN PATENT DOCUMENTS

| | | |
|---|---|---|
| JP | 2003-136628 | 5/2003 |
| JP | 2004-310502 | 11/2004 |

OTHER PUBLICATIONS

Written Opinion (Application No. PCT/JP2006/321928) Dated Feb. 6, 2007.

* cited by examiner

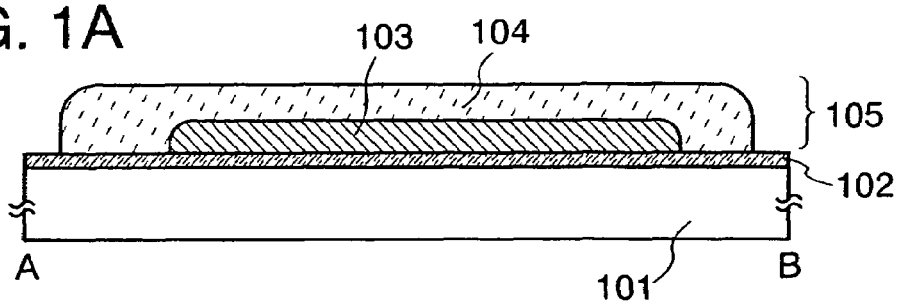
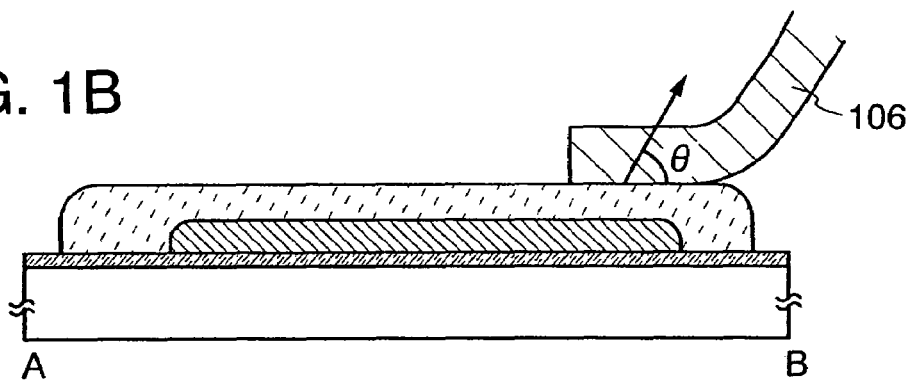
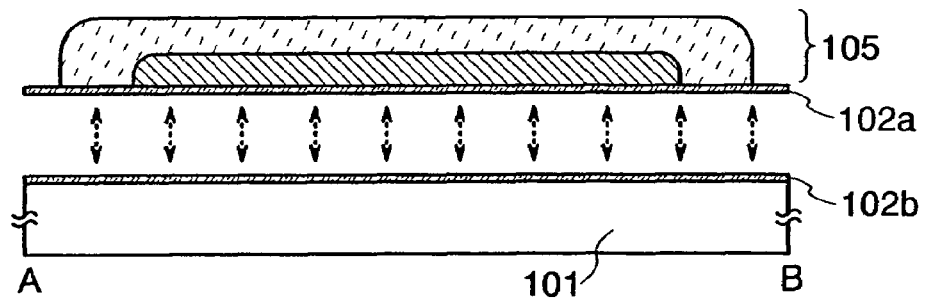
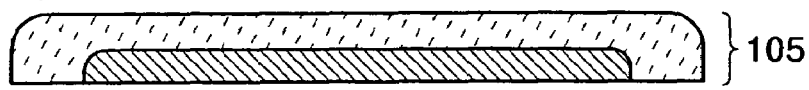
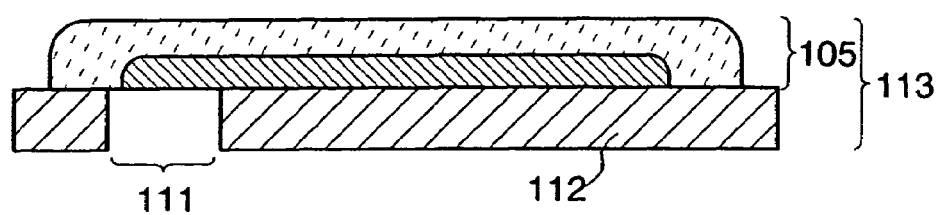

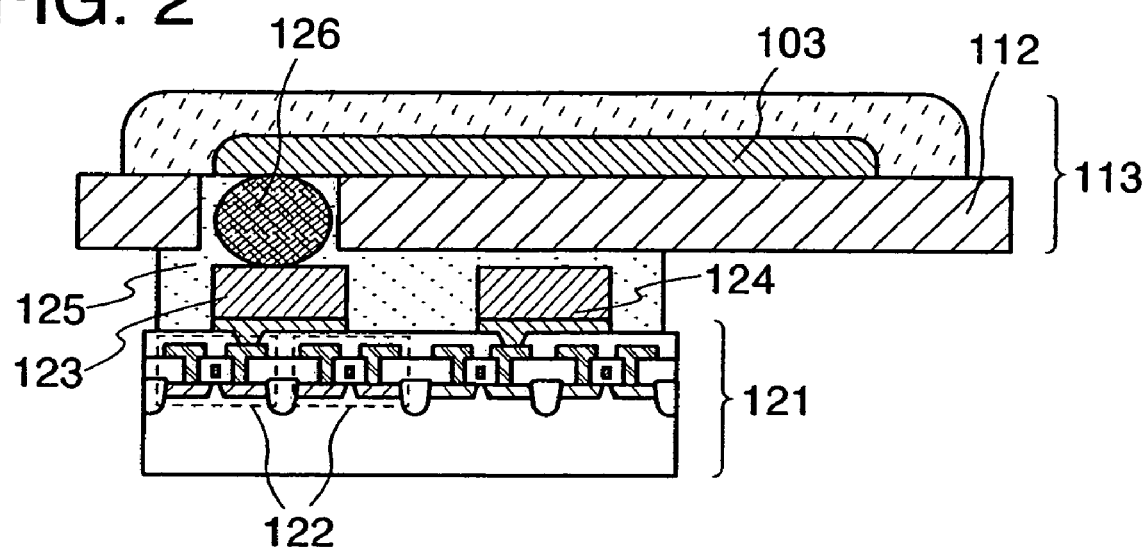

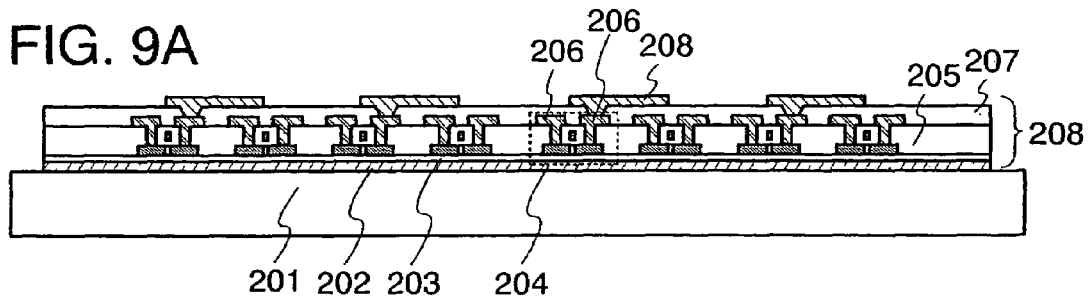
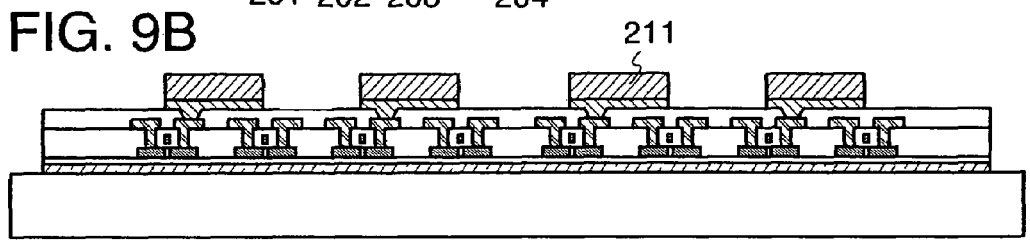
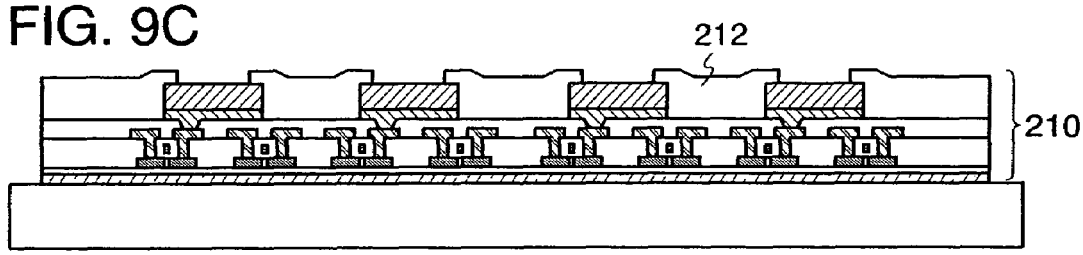
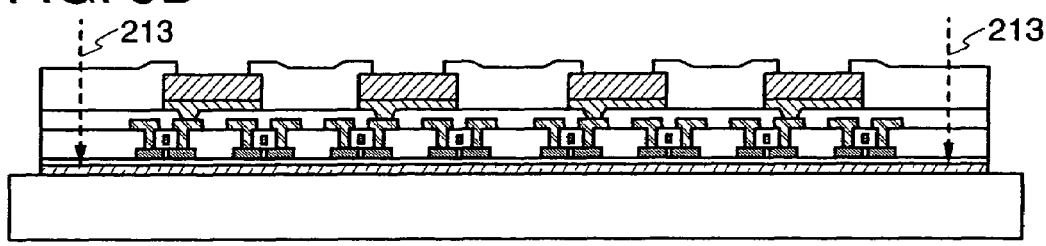
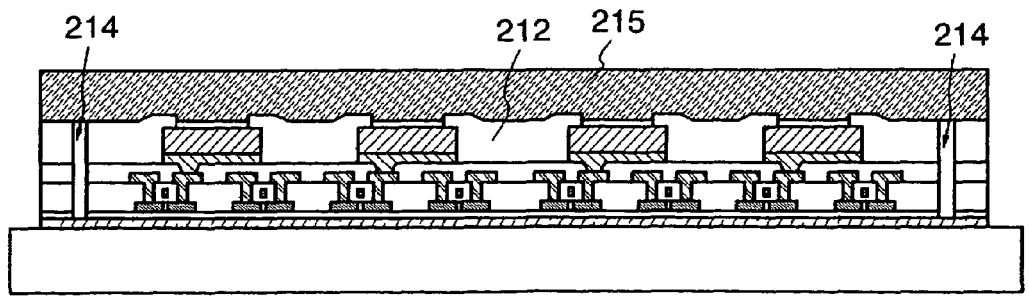

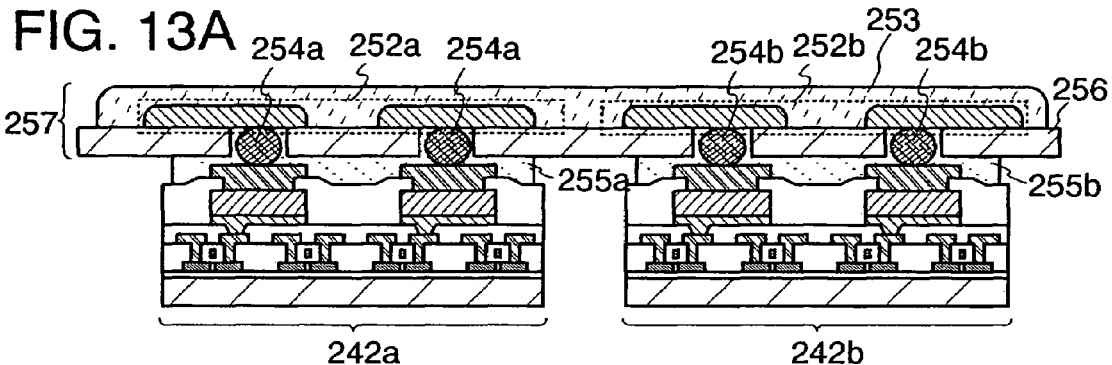
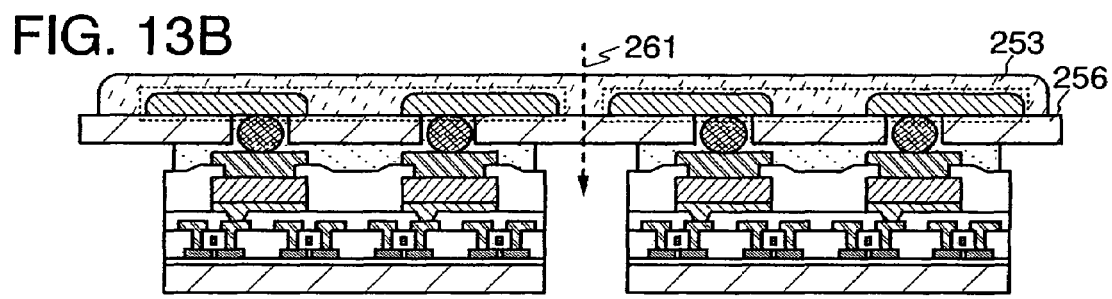
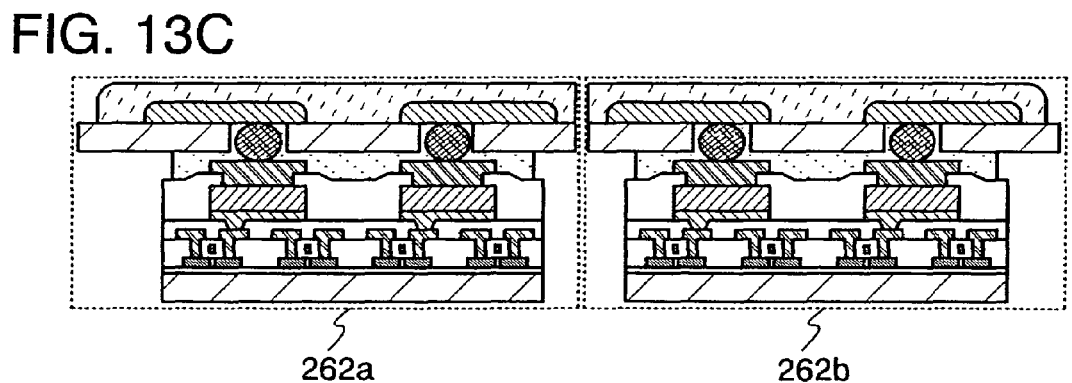
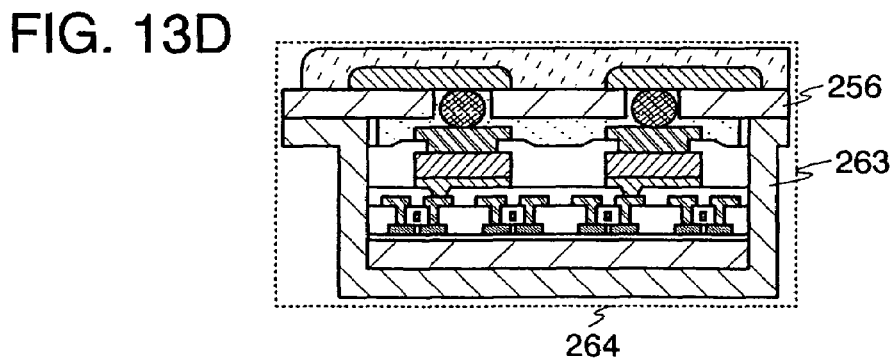

FIG. 15A
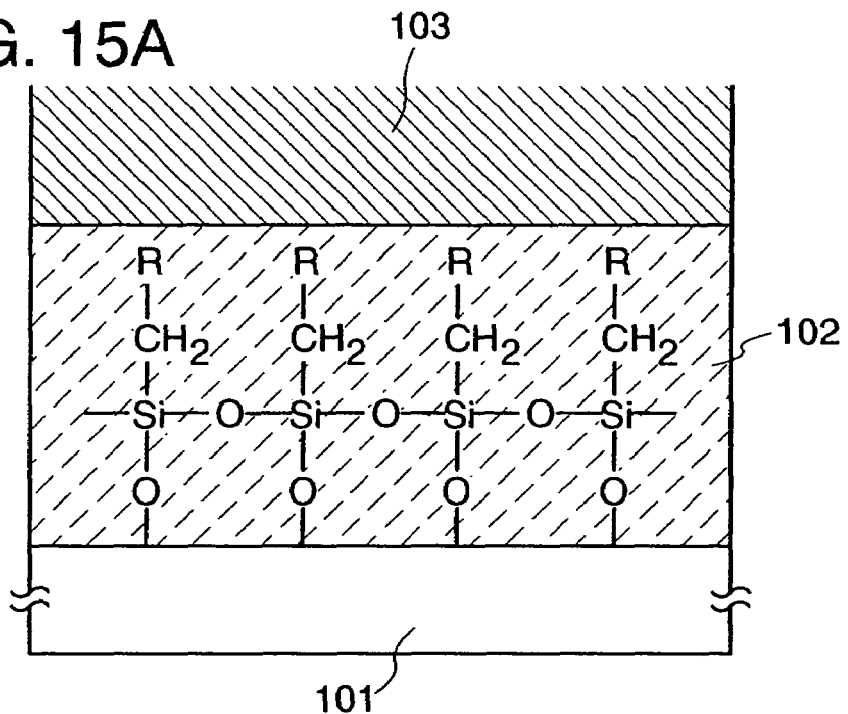
FIG. 15B
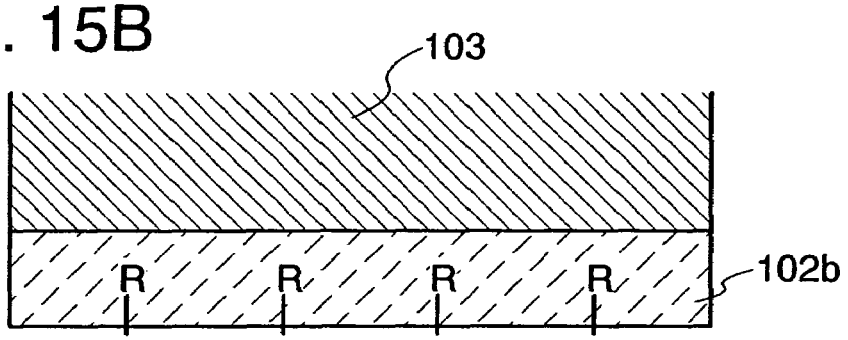
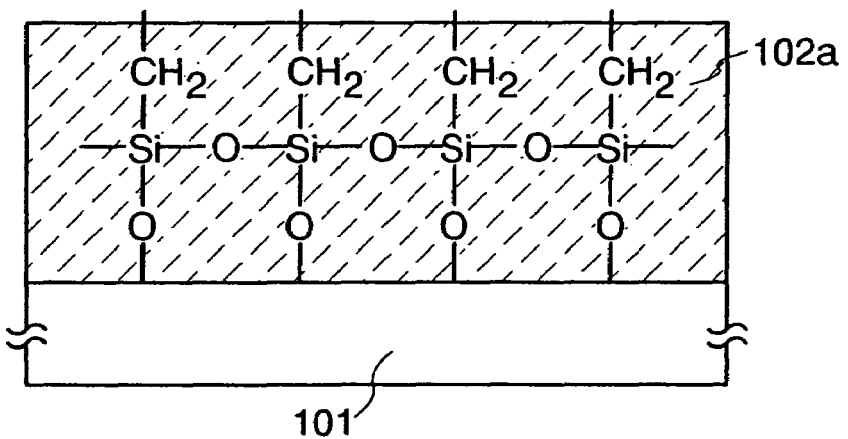

LAYER HAVING FUNCTIONALITY, METHOD FOR FORMING FLEXIBLE SUBSTRATE HAVING THE SAME, AND METHOD FOR MANUFACTURING SEMICONDUCTOR DEVICE

TECHNICAL FIELD

The present invention relates to a layer having functionality and a method for forming a flexible substrate having the same. Further, the present invention also relates to a method for manufacturing a semiconductor device having a layer having functionality.

BACKGROUND ART

As a conventional method for forming a conductive layer serving as an antenna, a pixel electrode, a wiring, or the like over a flexible substrate, the following methods are given: a method in which, after a composition that contains particles with a metal element is printed over a flexible substrate by a screen printing method, the composition is heated and baked to form a conductive layer; and a method in which a conductive layer is formed over a flexible substrate by a plating method.

Patent Document 1: Japanese Published Patent Application No. 2004-310502

DISCLOSURE OF INVENTION

In order to form a low-resistance conductive layer by using a composition that contains particles with a metal element, the composition is preferably heated at a high temperature, typically, 200° C. or higher to be baked. However, some flexible substrates have a low glass transition temperature depending on a material, which is lower than a baking temperature of a composition that contains particles with a metal element. Therefore, there is a problem that a flexible substrate is transformed in a case of directly printing a composition that contains particles with a metal element over the flexible substrate and performing heating and baking to form a low-resistance conductive layer.

On the other hand, in a plating method, a baking step is not necessary, and a low-resistance conductive layer can be formed at a comparatively low temperature of a room temperature to 100° C., approximately. However, in a plating method, there are problems that dangerous chemicals such as sulfuric acid, hydrochloric acid, and a cyanogens compound are used and that waste fluids become pollution.

Similarly to the above, a conventional color filter is generally formed using a coloring resin, a colorant dispersed resin, or the like. However, in order to make the resin harden, a heating step at a higher temperature than a glass transition temperature of a flexible substrate is necessary. Therefore, it was difficult to directly form a colored layer over a flexible substrate.

On the basis of described above, it is an object of the present invention to provide a method for forming a layer having functionality including a conductive layer and a colored layer, and a flexible substrate that has a layer having functionality with a high yield. Further, it is also an object of the present invention to provide a method for manufacturing a semiconductor device that is small-sized, thin, and light-weight.

One feature of the present invention is to include the steps of forming a layer having functionality after coating a substrate having heat resistance with a silane coupling agent, and peeling the layer having functionality from the substrate after attaching an adhesive to the layer having functionality.

Another feature of the present invention is to include the steps of forming a layer in which oxygen and silicon are combined and an inactive group is combined with the silicon over a substrate, forming a layer having functionality over the layer in which oxygen and silicon are combined and an inactive group is combined with the silicon, and peeling the layer having functionality from the substrate by dividing the layer in which oxygen and silicon are combined and an inactive group is combined with the silicon after attaching an adhesive to the layer having functionality.

Another feature of the present invention is to include the steps of forming a layer having functionality after coating a substrate having heat resistance with a silane coupling agent, peeling the layer having functionality from the substrate after attaching an adhesive to the layer having functionality, and attaching a flexible substrate to the layer having functionality.

Another feature of the present invention is to include the steps of forming a layer in which oxygen and silicon are combined and an inactive group is combined with the silicon over a substrate having heat resistance, forming a layer having functionality over the layer in which oxygen and silicon are combined and an inactive group is combined with the silicon, peeling the layer having functionality from the substrate by dividing the layer in which oxygen and silicon are combined and an inactive group is combined with the silicon after attaching an adhesive to the layer having functionality, and attaching a flexible substrate to the layer having functionality.

Another feature of the present invention is a semiconductor device that includes the layer having functionality or a substrate having the layer having functionality.

It is to be noted that the layer in which oxygen and silicon are combined and an inactive group is combined with the silicon, which remains over one surface of the layer having functionality, may be removed after peeing the layer having functionality. Alternatively, a flexible substrate may be attached to the layer having functionality after removing the layer in which oxygen and silicon are combined and an inactive group is combined with the silicon.

As a layer having functionality, a conductive layer serving as a wiring, an electrode, a pixel electrode, an antenna, or the like and an insulating layer covering the conductive layer are given. It is to be noted that one surface of the conductive layer is in contact with a silane coupling agent in a manufacturing step, and another surface of the conductive layer is in contact with the insulating layer.

In addition, as a layer having functionality, a colored layer and an insulating layer covering the colored layer are given. It is to be noted that one surface of the colored layer is in contact with a silane coupling agent in a manufacturing step, and another surface of the colored layer is in contact with the insulating layer.

Further, in a case where a plurality of conductive layers or a plurality of colored layers is included as a layer having functionality, an insulating layer covers all conductive layers or all colored layers.

An insulating layer of a layer having functionality preferably serves as a protective film for preventing deterioration and oxidization of the conductive layer and the colored layer. In addition, the insulating layer preferably serves as a planarizing layer for moderating unevenness of the conductive layer and the colored layer.

As a method for forming a layer having functionality, a droplet discharging method, a printing method such as screen printing, off-set printing, relief printing, or gravure printing, or the like is given. In addition, an evaporation method using a metal mask, a CVD method, a sputtering method, or the like is given. Further, a plurality of the above methods can be used.

When a layer having functionality is formed using a composition, a heating temperature is desired to be set at greater than or equal to 200° C. and less than or equal to 350° C., preferably greater than or equal to 200° C. and less than or equal to 300° C. When a heating temperature of the composition is less than 200° C., the composition is insufficiently baked. Alternatively, when the composition is heated at a higher temperature than 350° C., the layer in which oxygen and silicon are combined and an inactive group is combined with the silicon is reacted, and it becomes difficult to peel the layer having functionality from the substrate afterwards with ease.

In a case where a layer having functionality has a conductive layer serving as an antenna, a semiconductor device capable of transmitting and receiving data wirelessly is a typical example of a semiconductor device. Further, in a case where the layer having functionality is a layer having a pixel electrode, a display device is a typical example of the semiconductor device. Furthermore, in a case where the layer having functionality is a colored layer, a display device is a typical example of the semiconductor device.

A layer in which oxygen and silicon are combined and an inactive group is combined with the silicon is easily divided by physical force; therefore, a layer having functionality over the layer in which oxygen and silicon are combined and an inactive group is combined with the silicon can be peeled from a substrate. Accordingly, the layer having functionality that is formed over a substrate having heat resistance is peeled from the substrate, and the layer having functionality can be easily formed.

Further, by attaching the layer having functionality to a flexible substrate having low heat resistance, a flexible substrate having a layer having functionality can be formed. Therefore, a layer having functionality can be formed with a high yield by using a composition for which baking at a glass transition temperature of the flexible substrate or higher in a forming step is needed. In a case where a composition that contains particles with a metal element is used, a flexible substrate having a low-resistance conductive layer can be formed with a high yield.

Further, by coating a layer in which oxygen and silicon are combined and an inactive group is combined with the silicon, of which surface energy is low, with a composition by a printing method, unevenness on a side face of the printed composition can be reduced. Furthermore, the width of the composition can be controlled to make the layer thin. Therefore, a layer of which the width and a distance between the adjacent layers are uniform can be formed. Moreover, a layer of which the width is minuter than that of a layer formed by a conventional printing method can be formed.

By using such a layer for an antenna, an antenna having little variation in inductance can be formed. In addition, an antenna having high electromotive force can be formed. Further, by using such a layer for a wiring, a pixel electrode, a colored layer, or the like, a semiconductor device can be manufactured with a high yield. Furthermore, by using a flexible substrate having such a layer, a semiconductor device that is small-sized, thin, and lightweight can be achieved.

BRIEF DESCRIPTION OF DRAWINGS

FIGS. 1A to 1E are cross-sectional views for each showing a forming step of a functional layer of the present invention.

FIG. 2 is a cross-sectional view for showing a semiconductor device having a functional layer of the present invention.

FIGS. 9A to 9E are cross-sectional views for each showing a manufacturing step of a semiconductor device of the present invention.

FIGS. 13A to 13D are cross-sectional views for each showing a manufacturing step of a semiconductor device of the present invention.

FIGS. 15A and 15B are model views for each showing a forming step of a functional layer of the present invention.

BEST MODE FOR CARRYING OUT THE INVENTION

Figure 3A:
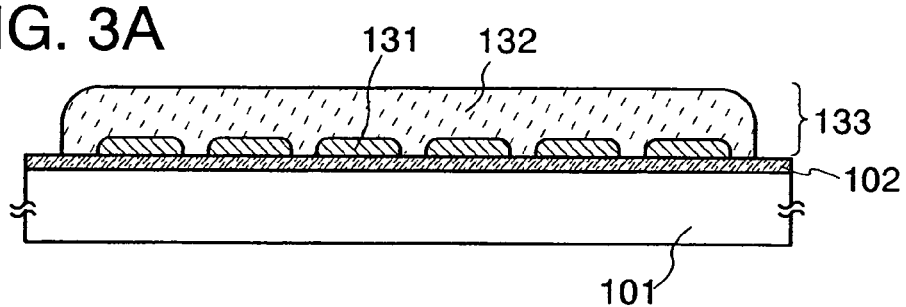
FIGS. 3A to 3E are cross-sectional views for each showing a forming step of a functional layer of the present invention.

Embodiment Modes of the present invention will be described below with reference to drawings. However, the present invention can be implemented in various different modes, and it is easily understood by those skilled in the art that various changes and modifications of the modes and details are possible, unless such changes and modifications depart from the content and the scope of the invention. Therefore, the present invention is not construed as being limited to the description of the following Embodiment Modes. It is to be noted that the same portion or a portion having the same function is denoted by the same reference numeral in all drawings for explaining Embodiment Modes, and the repetitive explanation thereof is omitted.

Embodiment Mode 1

Figure 7:
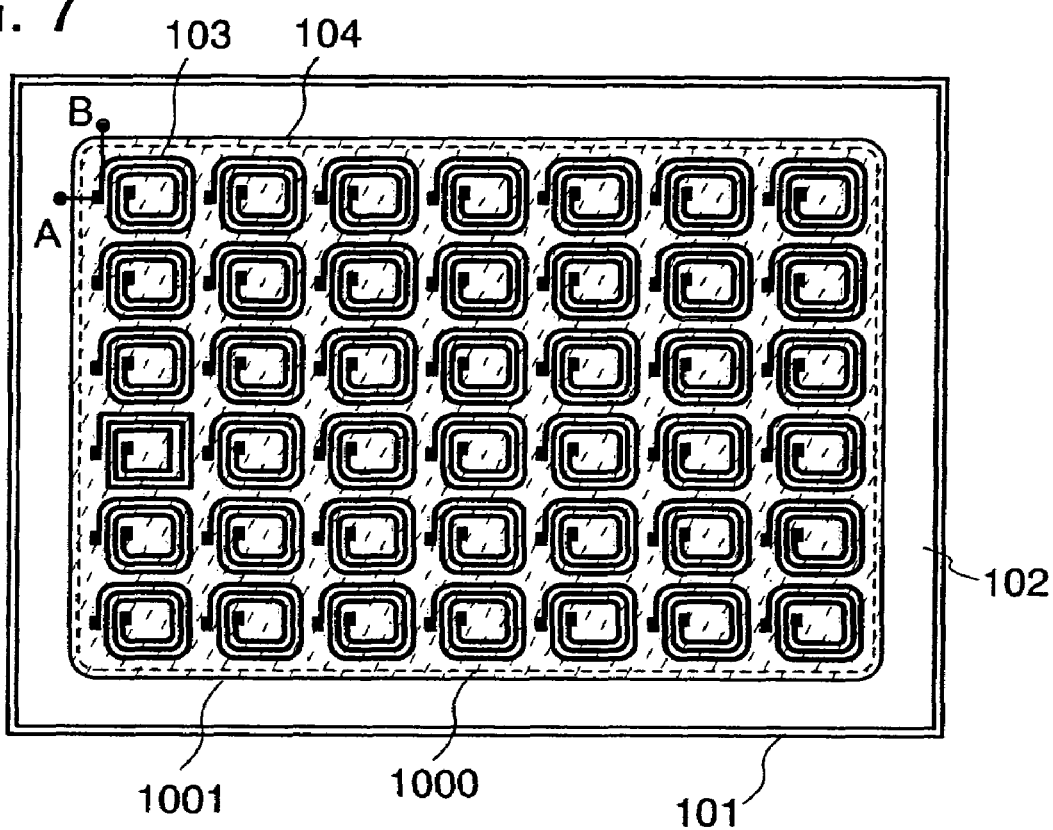
FIG. 7 is a top view for showing a forming a step of a functional layer of the present invention.

In this embodiment mode, one mode of a method for easily forming a layer having functionality will be explained with reference to FIGS. 1A to 1E, FIG. 2, FIG. 7, and FIGS. 15A and 15B. FIGS. 1A to 1E show cross-sectional views of a forming step of a layer having functionality. FIG. 2 shows a cross-sectional view of a semiconductor device capable of transmitting and receiving data wirelessly (also referred to as an RFID (Radio Frequency Identification) tag, an IC chip, an IC tag, an ID chip, an ID tag, an RF chip, an RF tag, a wireless chip, and a wireless tag). FIG. 7 shows a top view of FIG. 1A. A cross section A-B in FIG. 1A corresponds to a region A-B in FIG. 7. A layer having a conductive layer is used as a layer having functionality to explain this embodiment mode. In addition, the conductive layer here serves as an antenna. It is to be noted that this embodiment mode can be applied to a method for forming a layer having a colored layer as a layer having functionality instead of a conductive layer. In addition, this embodiment mode can be applied to a method for forming a pixel electrode, a wiring, and an electrode, and the like as a conductive layer, instead of an antenna.

As shown in FIG. 1A, a layer 102 in which oxygen and silicon are combined and an inactive group is combined with the silicon is formed by coating a substrate 101 with a silane coupling agent, a conductive layer 103 is formed thereover, and an insulating layer 104 covering the conductive layer 103 is formed. It is to be noted that a layer having functionality (hereinafter, referred to as a functional layer 105) can be formed by the conductive layer 103 and the insulating layer 104.

As the substrate 101, a substrate having heat resistance against a baking temperature of the conductive layer 103 is preferably used. Typically, a glass substrate, a quartz substrate, a ceramic substrate, a metal substrate, a silicon wafer, or the like can be used.

As the layer 102 in which oxygen and silicon are combined and an inactive group is combined with the silicon, a layer having high adhesion to the substrate 101 and low surface energy compared to a composition that is applied afterwards is preferably formed. The layer 102 in which oxygen and silicon are combined and an inactive group is combined with the silicon is formed by using a silane coupling agent. The saline coupling agent is a silicon compound indicated by $R_n$—Si—$X_{(4-n)}$ (n=1, 2, 3) (R is at least one selected from the functional groups of an alkyl group, an aryl group, a fluoroalkyl group, and a fluoroaryl group, and X is an alkoxyl group). A layer formed by using the silane coupling agent becomes a layer in which oxygen and silicon are combined and an inactive group is combined with the silicon.

As a typical alkoxyl group, an alkoxyl group having 1 to 4 carbon atoms, specifically, a methoxy group, an etoxy group, a propyloxy group, an isopropyloxy group, a butoxy group, an isobutoxy group, an s-butoxy group, a t-butoxy group or the like is given.

The number of the alkoxyl group is 1 to 3 of monoalkoxysilane, dialkoxysilane, trialkoxysilane.

As a typical example of a silicon compound containing an alkyl group as R, alkoxysilane containing an alkyl group having 2 to 30 carbon atoms is preferably used. Typically, ethyltriethoxysilane, propylethoxysilane, octyltriethoxysilane, decyltriethoxysilane, octadecyltriethoxysilane (ODS), eicosyltriethoxysilane, triacontyltriethoxysilane, and the like are given.

As alkoxylsilane containing an aryl group as R, alkoxysilane containing an aryl group having 6 to 8 carbon atoms is preferably used. Typically, phenyltriethoxysilane, benzyltriethoxysilane, phenethyltriethoxysilane, toluiltriethoxysilane, and the like are given.

As alkoxysilane containing a fluoroalkyl group as R, a fluoroalkyl group having 3 to 12 carbon atoms is preferably used. Typically, (3,3,3-trifluoropropyl)trietoxysilane, (tridecafluoro-1,1,2,2-tetrahydrooctyl)trietoxysilane, (heptadecafluoro-1,1,2,2-tetrahydrodecyl)triethoxysilane, (henicosafluoro-1,1,2,2-tetrahydrodecyl)triethoxysilane, and the like are given.

As alkoxylsilane containing a fluoroaryl group as R, alkoxysilane containing a fluoroaryl group having 6 to 9 carbon atoms is preferably used. Typically, pentafluorophenyltriethoxysilane, (pentafluorophenyl)propyltriethoxysilane, and the like are given.

It is to be noted that the layer in which oxygen and silicon are combined and an inactive group is combined with the silicon may be formed by using a solution in which a silane coupling agent is dissolved in a solvent. As the solvent in this case, hydrocarbon such as toluene, xylene, or hexadecane, a halogen solvent such as chloroform, tetrachloride, trichloroethylene, or tetrachloroethylene, alcohol such as methanol, ethanol, n-propanol, or isopropanol, and the like are given. As a method for forming the layer 102 in which oxygen and silicon are combined and an inactive group is combined with the silicon, a droplet discharging method, a printing method such as screen printing, off-set printing, relief printing, or gravure printing, or the like can be used. Alternatively, a vacuum evaporation method, an evaporation method, a CVD method, a sputtering method, or the like can be used. Here, a droplet discharging method indicates a method for forming a predetermined pattern by discharging a droplet of a composition from a minute hole.

A composition is applied over the layer 102 in which oxygen and silicon are combined and an inactive group is combined with the silicon by a coating method, and the composition is heated to bake particles with a metal element, thereby forming the conductive layer 103. As a coating method, a droplet discharging method, a printing method such as screen printing, off-set printing, relief printing, or gravure printing, or the like can be used. In addition, an evaporation method using a metal mask, a CVD method, a sputtering method, or the like can be used. Moreover, a plurality of the above methods can be used. Further, the composition is formed from particles with a metal element and a solvent for dispersing the particles with a metal element.

A heating temperature of the composition is desirably greater or equal to 200° C. and less than or equal to 350° C., preferably, greater than or equal to 200° C. and less than or equal to 300° C. When a heating temperature of the composition is lower than 200° C., the particles with a metal element is insufficiently baked and a conductive layer having high resistance is formed. Alternatively, when the composition is heated at a higher temperature than 350° C., the layer in which oxygen and silicon are combined and an inactive group is combined with the silicon is reacted and it becomes difficult to peel the function layer from the substrate afterwards with ease.

As the particles with a metal element, one or more of conductive particles of Ag, Au, Cu, Ni, Pt, Pd, Ir, Rh, W, Al, Ta, Mo, Cd, Zn, Fe, Ti, Zr, and Ba, or a compound particle having the element can be appropriately used.

Further, as particles with a metal element, a compound that contains one or more of elements of In, Ga, Al, Sn, Ge, Sb, Bi, and Zn, or two or more of compound particles is heated and baked, thereby forming a conductive layer having a light transmitting property.

As the compound particle with a metal element, an inorganic salt particle such as a metal halogen compound, a metal sulfated compound, a metal nitric compound, a metal oxide, a metal hydroxide, or a metal carbonate compound, or an organic salt particle such as a metal acetic acid compound, a metal oxalic acid compound, or a metal tartaric acid compound can be appropriately used.

A diameter of the particles with a metal element is preferably 1 nm to 10 μm, 1 to 5 μm, 1 to 100 nm, 2 to 50 nm, further preferably, 3 to 20 nm. By using such particles with a small grain size, the resistance of a conductive layer formed afterwards can be reduced.

In addition to the particles with a metal element, particles such as carbon, silicon, or germanium may be appropriately used.

As the solvent for dispersing the particles with a metal element, ester such as butyl acetate or ethyl acetate, alcohol such as isopropyl alcohol or ethyl alcohol, methyl ethyl ketone, acetone, or an organic resin such as an epoxy resin or a silicon resin (silicone) is appropriately used.

As the conductive layer 103, a conductive layer serving as an antenna, a wiring, a pixel electrode, an electrode, or the like can be appropriately formed.

Here, a shape of the composition that is applied over the layer 102 in which oxygen and silicon are combined and an inactive group is combined with the silicon will be explained with reference to FIGS. 15A and 15B. FIG. 15A is an enlarged model view for showing a region where the substrate 101 and the conductive layer 103 of FIG. 1A are contacted with the layer 102 in which oxygen and silicon are combined and an inactive group is combined with the silicon of FIG. 1A. FIG. 15B is an enlarged view of a region where the layer 102 in which oxygen and silicon are combined and an inactive group is combined with the silicon of FIG. 1C is divided, and the conductive layer 103 is peeled from the substrate 101.

In FIG. 15A, over the substrate 101, here, over a surface of a glass substrate, oxygen over the surface of the glass substrate and silicon in the layer 102 in which oxygen and silicon are combined and an inactive group is combined with the silicon are combined, and the silicon and a functional group R that is at least one selected from an alkyl group, an aryl group, a fluoroalkyl group, and a fluoroaryl group are combined. Further, the adjacent silicon is combined to each other through oxygen. Here, a substituent that is part of the functional group R is referred to as a $CH_2$ group and illustrated between the functional group R and silicon. It is to be noted that various substituents are shown without limitation to the $CH_2$ group as long as they are part of the functional group R.

In addition, a functional group R that is at least one selected from an alkyl group, an aryl group, a fluoroalkyl group, and a fluoroaryl group is exposed on the surface of the layer 102 in which oxygen and silicon are combined and an inactive group is combined with the silicon. Further, the conductive layer 103 is formed in contact with the functional group R.

An inactive functional group R typified by at least one selected from an alkyl group, an aryl group, a fluoroalkyl group, and a fluoroaryl group is exposed on the surface of the layer 102 in which oxygen and silicon are combined and an inactive group is combined with the silicon; therefore, surface energy in the surface of the layer 102 in which oxygen and silicon are combined and an inactive group is combined with the silicon is relatively lowered.

Further, as carbon chain length of a functional group becomes longer, a contact angle becomes larger, and the surface energy is relatively lowered. Accordingly, a composition having different surface energy from the surface of the layer 102 is easily repelled, and the composition flows over a surface of a film having small surface energy and stays in a stabilized shape.

In other words, the composition that is applied over the layer in which oxygen and silicon are combined and an inactive group is combined with the silicon becomes to have a shape for stabilizing the surface energy of the composition. Therefore, unevenness on a side face of the applied composition is reduced. By drying and baking such a paste, a conductive layer in which unevenness on a side face is moderated can be formed.

An insulating composition is applied by a coating method over an exposed portion of the layer 102 in which oxygen and silicon are combined and an inactive group is combined with the silicon and the conductive layer 103, and heating and baking are performed, thereby forming the insulating layer 104 covering the conductive layer 103. As a coating method, the coating method for the conductive layer 103 can be appropriately used. Further, as the insulating composition, an organic compound such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin; a siloxane polymer or an alkylsiloxane polymer, an alkylsilsesquioxane polymer, a silsesquioxane hydride polymer, an alkylsilsesquioxane hydride polymer, or the like typified by silica glass can be appropriately used.

In the present invention, the insulating layer 104 is preferably formed extending to an outer side 1001 of a region where the conductive layer 103 is formed (an inside of a dot line 1000 of FIG. 7) as shown in FIG. 7. That is, the insulating layer 104 is preferably formed to cover the whole conductive layer so as not to expose part of the side face of the conductive layer from the insulating layer. As a result, the conductive layer 103 is sealed by the insulating layer 104; therefore, oxidization of the conductive layer and mixture of an impurity can be prevented, and deterioration of the conductive layer can be suppressed. Further, since the insulating layer is formed so as to cover the whole conductive layer, the functional layer can be peeled as one layer without being divided in a subsequent peeling step.

Next, an adhesive 106 is attached to a surface of the insulating layer 104, typically, to part of or to the entire surface of the insulating layer 104; thereafter, the layer 102 in which oxygen and silicon are combined and an inactive group is combined with the silicon is physically divided with the use of the adhesive 106 as shown in FIG. 1B. Typically, the adhesive 106 is pulled up in a direction of an angle of θ degree with respect to the surface of the layer 102 in which oxygen and silicon are combined and an inactive group is combined with the silicon or the insulating layer 104. The angle of θ degree is other directions than a horizontal direction, specifically, $0°<\theta<180°$, preferably, $30°\leq\theta\leq160°$, more preferably, $60°\leq\theta\leq120°$. As a result, the layer 102 in which oxygen and silicon are combined and an inactive group is combined with the silicon is divided, and the functional layer 105 is peeled from the substrate 101 by dividing the layer 102 in which oxygen and silicon are combined and an inactive group is combined with the silicon. At this time, a part 102b of the layer in which oxygen and silicon are combined and an inactive group is combined with the silicon remains over the substrate 101, and a part 102a of the layer in which oxygen and silicon are combined and an inactive group is combined with the silicon remains over a surface of the functional layer 105 having the conductive layer 103. Thus, the layer 102 in which oxygen and silicon are combined and an inactive group is combined with the silicon works as a peeling layer.

Furthermore, in a case where a roller is provided over the adhesive 106 and the layer 102 in which oxygen and silicon are combined and an inactive group is combined with the silicon is physically divided from the substrate by rotation of the roller, the angle of θ degree is $0°<\theta<90°$, preferably, $0°<\theta<45°$. As a result, the functional layer 105 can be peeled from the substrate 101 while a crack is prevented from occurring in the functional layer 105.

Here, a principle that the layer 102 in which oxygen and silicon are combined and an inactive group is combined with the silicon is divided and the functional layer 105 is peeled from the substrate 101 is explained with the use of FIG. 15B. When the adhesive 106 is pulled up as shown in FIG. 1B, the binding power inside the inactive group is lowered as compared to adhesion between a surface of the substrate 101 and the layer 102 in which oxygen and silicon are combined and an inactive group is combined with the silicon and adhesion between the layer 102 in which oxygen and silicon are combined and an inactive group is combined with the silicon and the conductive layer 103. In other words, the binding power inside the inactive group is weak as compared to binding power of oxygen and silicon over the substrate 101 and adhesion between the conductive layer 103 and the layer 102 in which oxygen and silicon are combined and an inactive group is combined with the silicon. Therefore, as shown in FIG. 15B, combination of the functional group R that is at least one selected from an alkyl group, an aryl group, a fluoroalkyl group, and a fluoroaryl group is partially cut off, and the layer in which oxygen and silicon are combined and an inactive group is combined with the silicon is divided. As a result, the functional layer 105 can be peeled from the substrate 101.

Since the combination of the functional group R that is at least one selected form an alkyl group, an aryl group, a fluoroalkyl group, and a fluoroaryl group is partially cut off, a remaining part of the alkyl group, the aryl group, the fluoroalkyl group, and the fluoroaryl group is left over the surface of the substrate. Accordingly, a contact angle is large and the surface energy is relatively small over a surface of the part 102b of the layer in which oxygen and silicon are combined and an inactive group is combined with the silicon that is divided. Therefore, a composition having different surface energy from the surface of the part 102b of the layer is easily repelled over the layer, and the composition flows over a surface of a film having small surface energy and stays in a stabilized shape. As a result, the substrate 101 having the part 102b of the layer in which oxygen and silicon are combined and an inactive group is combined with the silicon that is divided can be used for forming a functional layer again.

Here, as the adhesive 106, an optical plastic adhesive film, a thermoplastic adhesive film, or the like can be used. Instead of a film, a tape, a sheet, a substrate, or the like can be appropriately used. Moreover, instead of using the adhesive, a material may be attached to the surface of the insulating layer 104 by electrostatic force or adsorption power.

Next, as shown in FIG. 1D, the part 102a of the layer in which oxygen and silicon are combined and an inactive group is combined with the silicon that remains over a surface of the functional layer 105 having the conductive layer 103 may be removed. The part of the layer in which oxygen and silicon are combined and an inactive group is combined with the silicon can be removed by plasma irradiation of hydrogen, a rare gas, nitrogen, or the like, or heating treatment at 400° C. or higher. Through the above step, a functional layer can be easily formed. In addition, a functional layer having a conductive layer in which unevenness on a side face is reduced or a thinned conductive layer can be easily formed.

Next, as shown in FIG. 1E, a flexible substrate 112 having an opening 111 is attached to the functional layer 105. As the flexible substrate 112, a substrate made from PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like; and a substrate having a stacked layer of paper made of a fibrous material and an adhesive organic resin (an acrylic-based organic resin, an epoxy-based organic resin, or the like) can be typically used. In a case of using the above substrate, the functional layer 105 and the flexible substrate 112 are attached with an adhesive organic resin layer interposed therebetween, which is not illustrated.

Alternatively, as the flexible substrate 112, a film having an adhesive layer that is subjected to adhesion treatment with an object to be processed by thermocompression (such as a laminating film (including polypropylene, polyester, vinyl, polyvinyl fluoride, vinyl chloride, or the like)) may be used. The laminating film can be attached to an object to be processed in such a way that an adhesive layer provided on an uppermost layer or a layer provided on an outermost layer (not the adhesive layer) is melted by heat treatment and then, by applying pressure thereto, the film is attached to the object to be processed.

The opening 111 formed in the flexible substrate 112 can be formed by irradiating the flexible substrate with laser light and melting part of the flexible substrate. Alternatively, the flexible substrate is subjected to mechanical punching to form the opening.

By the above step, a flexible substrate having a functional layer can be formed with a high yield. Since heating at a sufficient temperature can be performed, a flexible substrate having a low-resistance conductive layer can be formed with a high yield. Further, a flexible substrate having a functional layer that has a conductive layer in which unevenness on a side face is reduced or a thinned conductive layer can be formed with a high yield. Furthermore, in a case of forming an antenna by using these conductive layers, among a plurality of antennas that is concurrently formed, a substrate having an antenna that has little variation in inductance can be formed. Moreover, a substrate having an antenna that has little variation in electromotive force can be formed.

Next, as shown in FIG. 2, a semiconductor device can be manufactured by attaching a flexible substrate 113 having a functional layer to a silicon chip 121.

Typically, connection terminals 123 and 124 of the silicon chip 121 where a plurality of elements are formed and the conductive layer 103 of the functional layer are connected to each other with a conductive particle 126 contained in an anisotropic conductive adhesive agent 125, whereby a MOS transistor 122 and the conductive layer 103 are electrically connected. As the plurality of elements, the MOS transistor, a capacitor element, a resistor, and the like are given. Here, the MOS transistor 122 is shown as one of the plurality of elements. A thickness of the silicon chip is preferably 0.1 to 20 μm, further preferably, 1 to 5 μm.

The connection terminals 123 and 124 can be formed using titanium, nickel, gold, copper, or the like appropriately, by a printing method, an electrolytic plating method, an electroless plating method, a sputtering method, or the like.

As a typical example of the anisotropic conductive adhesive agent 125, an adhesive resin containing the conductive particle 126 (a grain size is several nm to several tens μm, preferably about 3 to 7 μm), which is dispersed, such as an epoxy resin or a phenol resin can be given. The conductive particle 126 is formed from an element selected from gold, silver, copper, palladium, and platinum; or a plurality of elements. Further, a particle having a multi-layer structure of these elements may be used. Furthermore, a conductive particle in which a thin film that is formed from an element selected from gold, silver, copper, palladium, and platinum, or a plurality of the elements is formed over a surface of a particle formed from a resin may be used.

The connection terminals 123 and 124 may be connected to the conductive layer 103 by a method such as compression of an anisotropic conductive film and reflow treatment using a solder bump instead of the anisotropic conductive adhesive agent.

By the above step, a semiconductor device capable of transmitting and receiving data wirelessly can be manufactured with a high yield.

Embodiment Mode 2

In this embodiment mode, one mode of a method for easily forming a layer having functionality will be explained with reference to FIGS. 3A to 3E and FIG 4. FIGS. 3A to 3E each show a cross-sectional view of a step for forming a layer having functionality. FIG. 4 shows a cross-sectional view of a liquid crystal display device as a display device in a case where the display device is used as a semiconductor device. A layer having a conductive layer serving as a pixel electrode is used as a layer having functionality to explain this embodiment mode.

Figure 4:
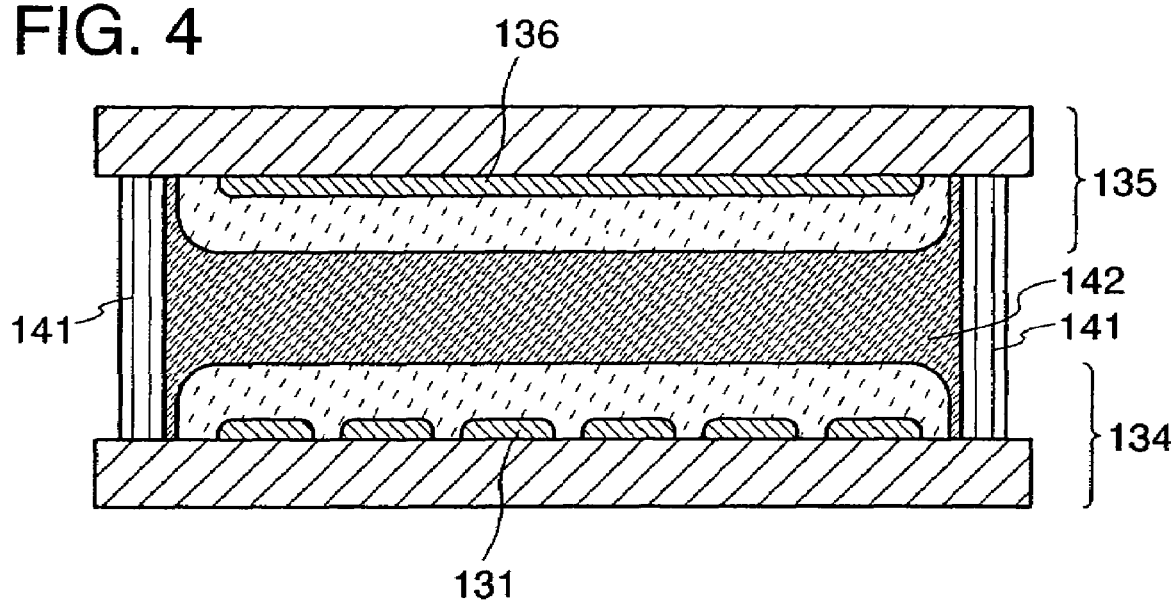
FIG. 4 is a cross-sectional view for showing a semiconductor device having a functional layer of the present invention.

As shown in FIG. 3A, a layer 102 in which oxygen and silicon are combined and an inactive group is combined with the silicon is formed over a substrate 101, a conductive layer 131 is formed thereover, and an insulating layer 132 covering the conductive layer 131 is formed. A functional layer 133 can be formed by the conductive layer 131 and the insulating layer 132.

The substrate 101 and the layer 102 in which oxygen and silicon are combined and an inactive group is combined with the silicon can be formed in a manner similar to that of Embodiment Mode 1.

A composition that contains particles with a metal element is applied over the layer 102 in which oxygen and silicon are combined and an inactive group is combined with the silicon, and heating is performed at a temperature of greater than or equal to 200° C. and less than or equal to 350° C., preferably, greater than or equal to 200° C. and less than or equal to 300° C. to bake the particles with a metal element, thereby forming the conductive layer 131. As a coating method, a droplet discharging method, a printing method such as screen printing, off-set printing, relief printing, or gravure printing, or the like can be used. Further, an evaporation method using a metal mask, a CVD method, a sputtering method, or the like can be used. Furthermore, a plurality of the methods can be used. As the composition that contains particles with a metal element, a composition for forming a conductive layer having a light transmitting property is preferably used. Typically, a composition that contains a conductive particle having one or more of elements of In, Ga, Al, Sn, Ge, Sb, Bi, and Zn, or two or more of compounds particles can be used.

As the conductive layer 131, a conductive layer serving as a pixel electrode is appropriately formed here. Typically, a striped-shape conductive layer 131 is formed.

An insulating composition is applied over exposed portions of the layer in which 102 oxygen and silicon are combined and an inactive group is combined with the silicon and the conductive layer 131 by a coating method, and heating and baking are performed, thereby forming the insulating layer 132 covering the conductive layer 131. As a coating method, the coating method for the conductive layer 131 can be appropriately used. As the insulating composition, an acrylic resin, polyimide, or the like can be appropriately used. Here, the insulating layer 132 preferably serves as a protective layer for the conductive layer 131, furthermore, an orientation film. Therefore, the insulating layer 132 may be subjected to rubbing treatment.

Through the above step, the functional layer 133 having a conductive layer that serves as a pixel electrode can be formed.

Figure 3B:
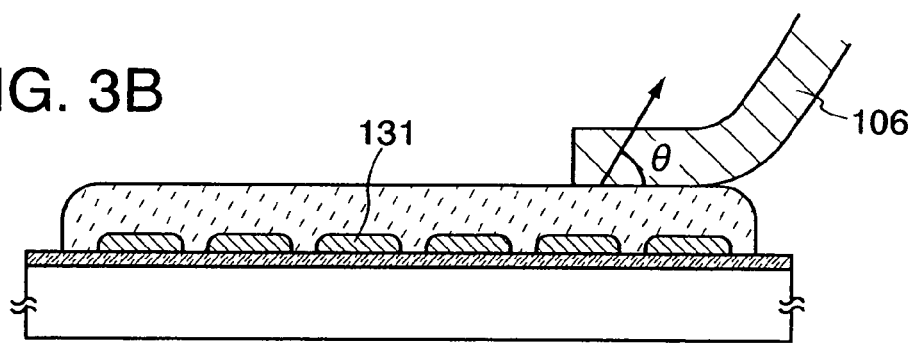
Figure 3C:
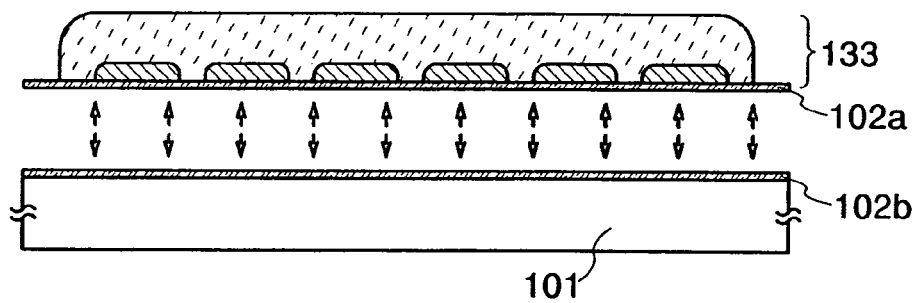

Next, as shown in FIG. 3B, an adhesive 106 is attached to a surface of the insulating layer 132, typically, part of or an entire surface of the insulating layer 132 in a similar manner to Embodiment Mode 1, and thereafter, the adhesive 106 is pulled up. As a result, as shown in FIG. 3C, the layer 102 in which oxygen and silicon are combined and an inactive group is combined with the silicon is divided, and the functional layer 133 is peeled from the substrate 101. At this time, a part 102b of the layer in which oxygen and silicon are combined and an inactive group is combined with the silicon remains over the substrate 101, and a part 102a of the layer in which oxygen and silicon are combined and an inactive group is combined with the silicon remains over a surface of the functional layer 133 having the conductive layer 131.

Figure 3D:
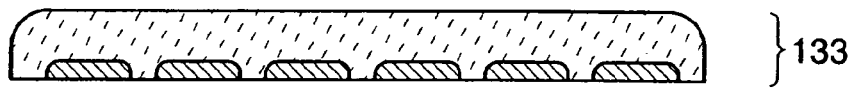

Subsequently, as shown in FIG. 3D, the part 102a of the layer in which oxygen and silicon are combined and an inactive group is combined with the silicon that remains over a surface of the functional layer 133 having the conductive layer 131 may be removed in a manner similar to that of Embodiment Mode 1. Through the above step, the functional layer 133 can be easily formed.

Figure 3E:
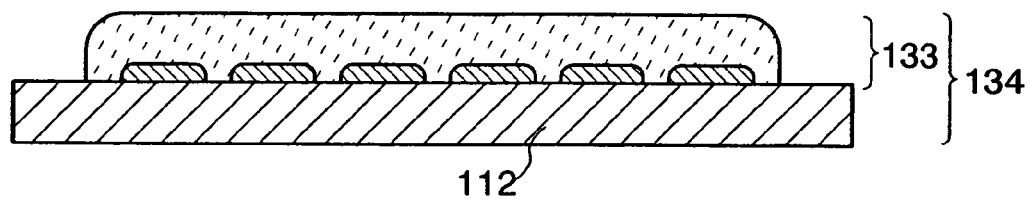

Then, as shown in FIG. 3E, a flexible substrate 112 is attached to the functional layer 133.

Through the above step, a flexible substrate 134 having a pixel electrode as a functional layer can be formed with a high yield.

Next, a flexible substrate 135 having a functional layer is similarly formed. A sealant is applied in a region where the functional layer 133 is not formed over one of the flexible substrates having functionality, and a liquid crystal material is applied inside the sealant. Then, the conductive layer 131 formed over the flexible substrate 134 and a conductive layer 136 formed over the flexible substrate 135 are arranged to be intersected with each other at right angles, and attachment is performed while a pressure is reduced. Please note that the conductive layer 136 serves as an opposite electrode. As a result, a passive matrix liquid crystal display device including a sealant 141 for sealing the flexible substrates 134 and 135, the flexible substrates 134 and 135, and a liquid crystal layer 142 that is formed in a region surrounded by the sealant is manufactured. By the above step, a liquid crystal display device can be manufactured with a high yield. Further, a liquid crystal display device that is. small-sized, thin, and lightweight can be manufactured.

Embodiment Mode 3

In this embodiment mode, one mode of a method for easily forming a layer having functionality will be explained with reference to FIGS. 5A to 5E and FIGS. 6A to 6E. FIGS. 5A to 5E each show a cross-sectional view of a forming step of a layer having functionality. As a layer having functionality, a layer that optically functions such as a colored layer, a color conversion filter, or a photogram color filter can be given in this embodiment mode. Here, a colored layer is used as a layer that optically functions to explain this embodiment mode.

Figure 5A:
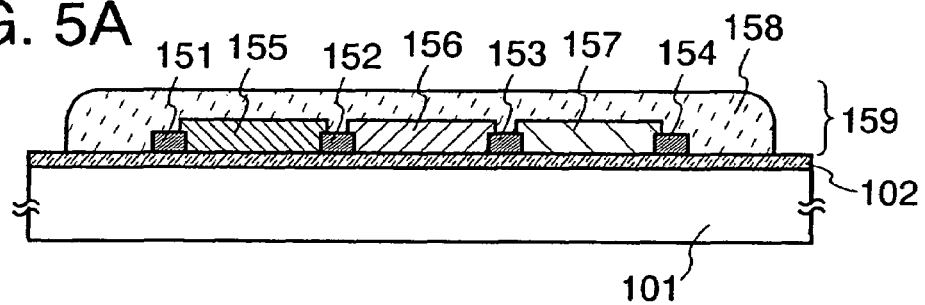
FIGS. 5A to 5E are cross-sectional views for each showing a forming step of a functional layer of the present invention.

As shown in FIG. 5A, a layer 102 in which oxygen and silicon are combined and an inactive group is combined with the silicon is formed over a substrate 101, a colored layer is formed thereover, and an insulating layer 158 covering a colored layer is formed. Here, light shielding layers 151 to 154, a red colored layer 155, a blue colored layer 156, and a green colored layer 157 are shown as the colored layer. A functional layer 159 can be formed by the colored layer and the insulating layer 158.

As a method for forming the colored layer, an etching method using a colored resin, a color resist method using a color resist, a staining method, an electrodeposition method, a micelle electrolytic method, an electrodeposition transfer method, a film dispersion method, an inkjet method (droplet discharging method), or the like can be appropriately used.

Here, a color filter is formed by an etching method using a photosensitive resin in which colorant is dispersed. First, a photosensitive acrylic resin in which black colorant is dispersed is applied to the layer 102 in which oxygen and silicon are combined and an inactive group is combined with the silicon by a coating method. Subsequently, after the acrylic resin is dried and temporarily baked, exposure and development are performed, and then, the acryl is hardened by heating at greater than or equal to 200° C. and less than or equal to 350° C., preferably greater than or equal to 200° C. and less than or equal to 300° C., here, 220° C., to form the light shielding layers 151 to 154 with a film thickness of 0.5 to 1.5 μm.

Next, photosensitive acrylic resins in each of which red colorant, green colorant, and blue colorant are dispersed are applied to form the red colored layer 155, the blue colored layer 156, and the green colored layer 157, each having a film thickness of 1.0 to 2.5 μm, by a step similar to that of the light shielding layers 151 to 154.

Through the above step, the colored layer can be easily formed.

It is to be noted that the red colored layer indicates a colored layer that transmits red light (light having a peak wavelength in the vicinity of 650 nm), the green colored layer indicates a colored layer that transmits green light (light having a peak wavelength in the vicinity of 550 nm), and the blue colored layer indicates a colored layer that transmits blue light (light having a peak wavelength in the vicinity of 450 nm).

An insulating composition is applied to exposed portions of the layer 102 in which oxygen and silicon are combined and an inactive group is combined with the silicon, the colored layers 155 to 157, and the light shielding layers 151 to 154, and heating and baking are performed, thereby forming the insulating layer 158 covering the colored layers. The insulating layer 158 can be formed with a method and material similar to those of the insulating layer 132 in Embodiment Mode 1. Further, the insulating layer 158 serves as a protective layer for the colored layer.

Through the above step, the functional layer 159 that serves as a colored layer can be formed with a high yield.

Figure 5B:
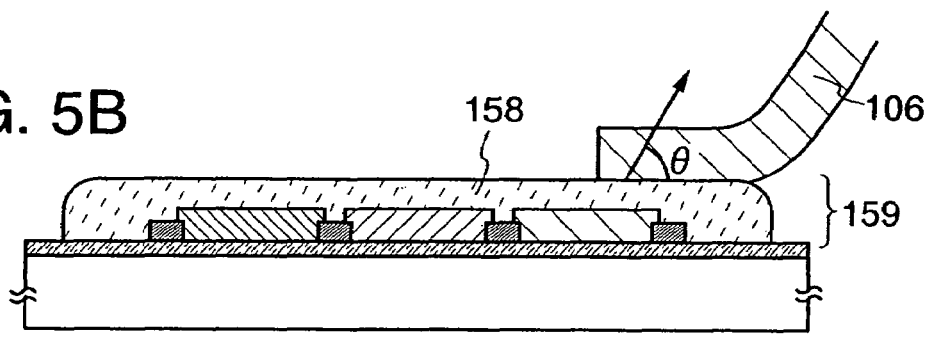

Next, as shown in FIG. 5B, an adhesive 106 is attached to part of or to an entire surface of the insulating layer 158 in a manner similar to that of Embodiment Mode 1, and thereafter, the adhesive 106 is pulled up.

Figure 5C:
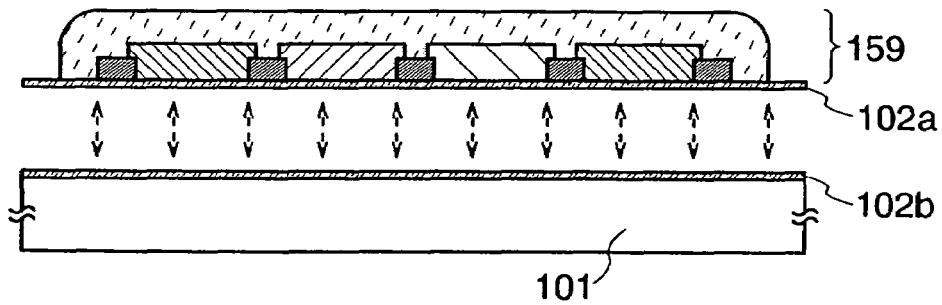

As a result, the layer 102 in which oxygen and silicon are combined and an inactive group is combined with the silicon is divided, and the functional layer 159 is peeled from the substrate 101 as shown in FIG. 5C. At this time, a part 102b of the layer in which oxygen and silicon are combined and an inactive group is combined with the silicon remains over the substrate 101, and a part 102a of the layer in which oxygen and silicon are combined and an inactive group is combined with the silicon remains over a surface of the functional layer 159 having the colored layer.

Figure 5D:

Subsequently, as shown in FIG. 5D, the part 102a of the layer in which oxygen and silicon are combined and an inactive group is combined with the silicon that remains over a surface of the functional layer 159 having the colored layer may be removed in a manner similar to that of Embodiment Mode 1.

Figure 5E:
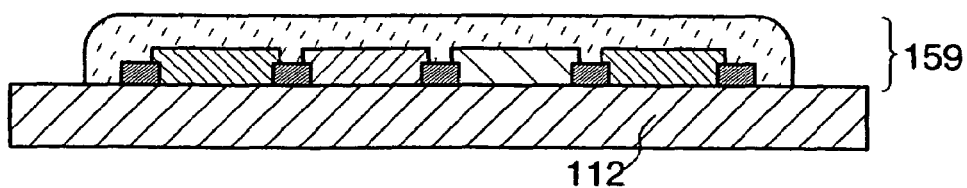

Then, as shown in FIG. 5E, a flexible substrate 112 is attached to the functional layer 159.

Through the above step, a flexible substrate having the functional layer 159 can be formed with a high yield.

Embodiment Mode 4

In this embodiment mode, one mode of a method for manufacturing a liquid crystal display device will be explained with reference to FIGS. 6A to 6E. It is to be noted that FIGS. 6A to 6E each show a cross-sectional view of a manufacturing step of a liquid crystal display device.

Figure 6A:
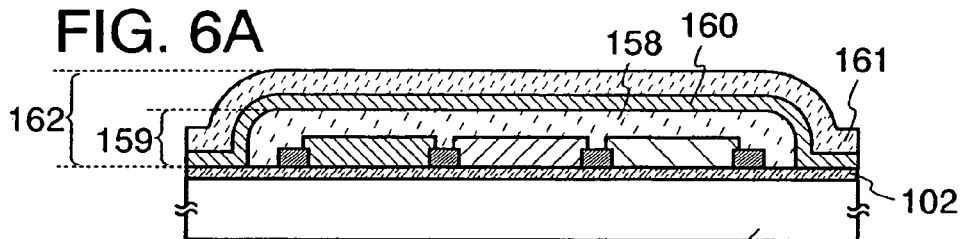
FIGS. 6A to 6E are cross-sectional views for each showing a semiconductor device having a functional layer of the present invention.

As shown in FIG. 6A, a layer 102 in which oxygen and silicon are combined and an inactive group is combined with the silicon is formed over a substrate 101 by the step shown in FIG. 5A of Embodiment Mode 3, a colored layer including light shielding layers 151 to 154, a red colored layer 155, a blue colored layer 156, and a green colored layer 157 is formed thereover, and an insulating layer 158 covering the colored layer is formed.

Next, an opposite electrode 160 is formed over the insulating layer 158, and an insulating layer 161 serving as an orientation film is formed thereover.

The opposite electrode 160 is formed over exposed regions of the insulating layer 158 and the layer 102 in which oxygen and silicon are combined and an inactive group is combined with the silicon. The formation method and material of the conductive layer 131 serving as a pixel electrode in Embodiment Mode 2 can be used similarly to that of the opposite electrode 160. Further, the opposite electrode 160 may be formed by using a sputtering method.

The insulating layer 161 can be formed by using the material and method similar to those of the insulating layer 132 in Embodiment Mode 2 appropriately.

Through the above step, a functional layer 162 can be formed.

Figure 6B:
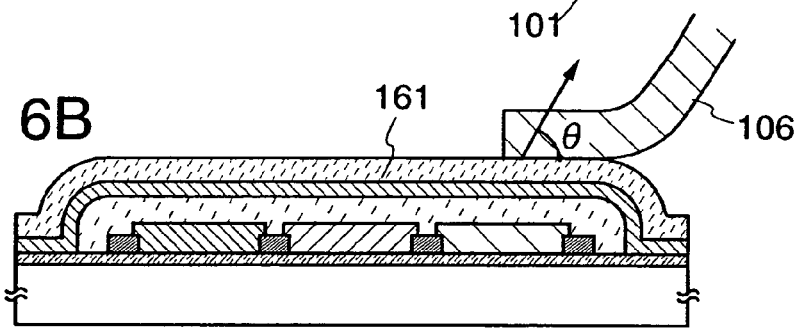

Next, as shown in FIG. 6B, an adhesive 106 is attached to a surface of the insulating layer 161, typically, to part of or to the entire surface of the insulating layer 161, and thereafter, the adhesive 106 is pulled up in a θ direction in a manner similar to that of Embodiment Mode 1.

Figure 6C:
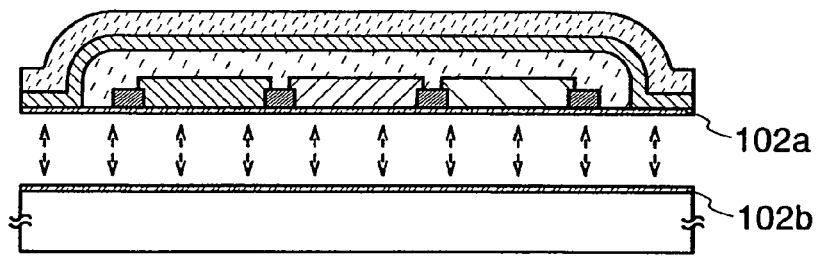

As a result, as shown in FIG. 6C, the layer 102 in which oxygen and silicon are combined and an inactive group is combined with the silicon is divided, and the functional layer 162 is peeled from the substrate 101. At this time, a part 102b of the layer in which oxygen and silicon are combined and an inactive group is combined with the silicon remains over the substrate 101, and a part 102a of the layer in which oxygen and silicon are combined and an inactive group is combined with the silicon remains over a surface of the functional layer 162 having the colored layer. Thereafter, the part 102a of the layer in which oxygen and silicon are combined and an inactive group is combined with the silicon that remains over a surface of the functional layer 162 having the colored layer may be removed in a manner similar to that of Embodiment Mode 1.

Figure 6D:
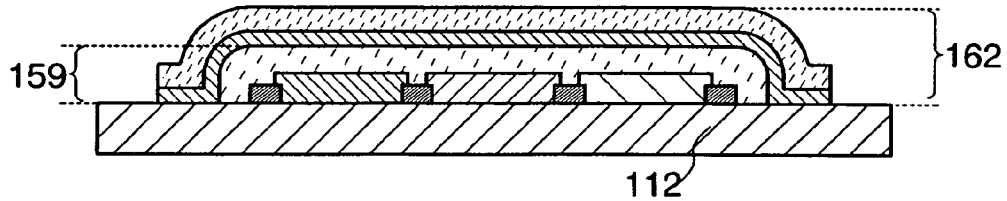

Next, as shown in FIG. 6D, a flexible substrate 112 is attached to the functional layer 162.

Through the above step, a flexible substrate having the functional layer 162 can be manufactured.

Figure 6E:
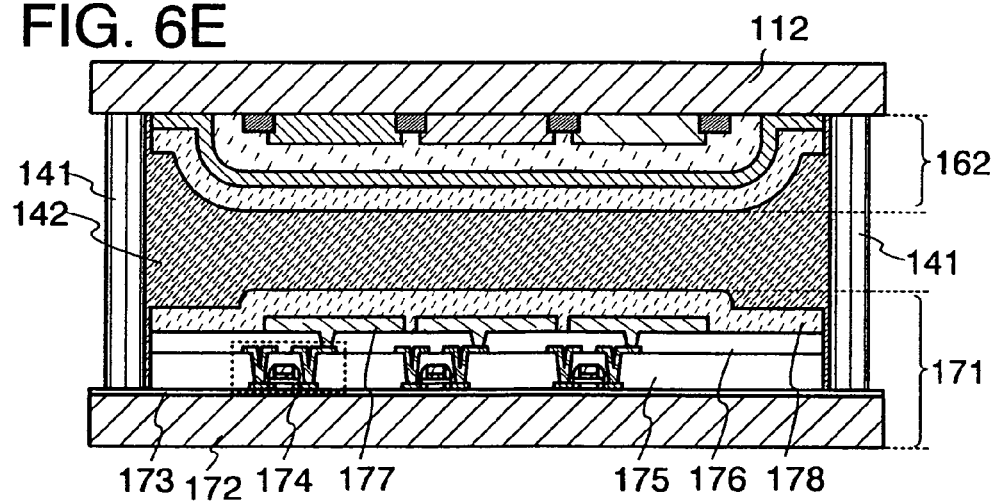

Next, as shown in FIG. 6E, an insulating layer 173 is formed over a substrate 172. Over the insulating layer 173, a thin film transistor 174, an interlayer insulating layer 175 that insulates a conductive layer forming the thin film transistor 174, an interlayer insulating layer 176 covering the thin film transistor 174, and a pixel electrode 177 that is formed over the interlayer insulating layer 176 and connected to the thin film transistor 174 are formed. An insulating layer 178 serving as an orientation film is formed over the pixel electrode 177 and the interlayer insulating layer 176. An active matrix substrate 171 is formed of the above components. The active matrix substrate 171 and the flexible substrate 112 having the functional layer 162 over which a sealant 141 and a liquid crystal material are applied are attached under a reduced pressure, whereby a liquid crystal display device can be manufactured. That is, an active matrix liquid crystal display device can be manufactured, which includes the flexible substrate 112 having the functional layer 162, the sealant 141, the active matrix substrate 171, and a liquid crystal layer 142.

Through the above step, a liquid crystal display device can be manufactured with a high yield. Further, a liquid crystal display device that is small-sized, thin, and lightweight can be manufactured.

Embodiment 1

Figure 8:
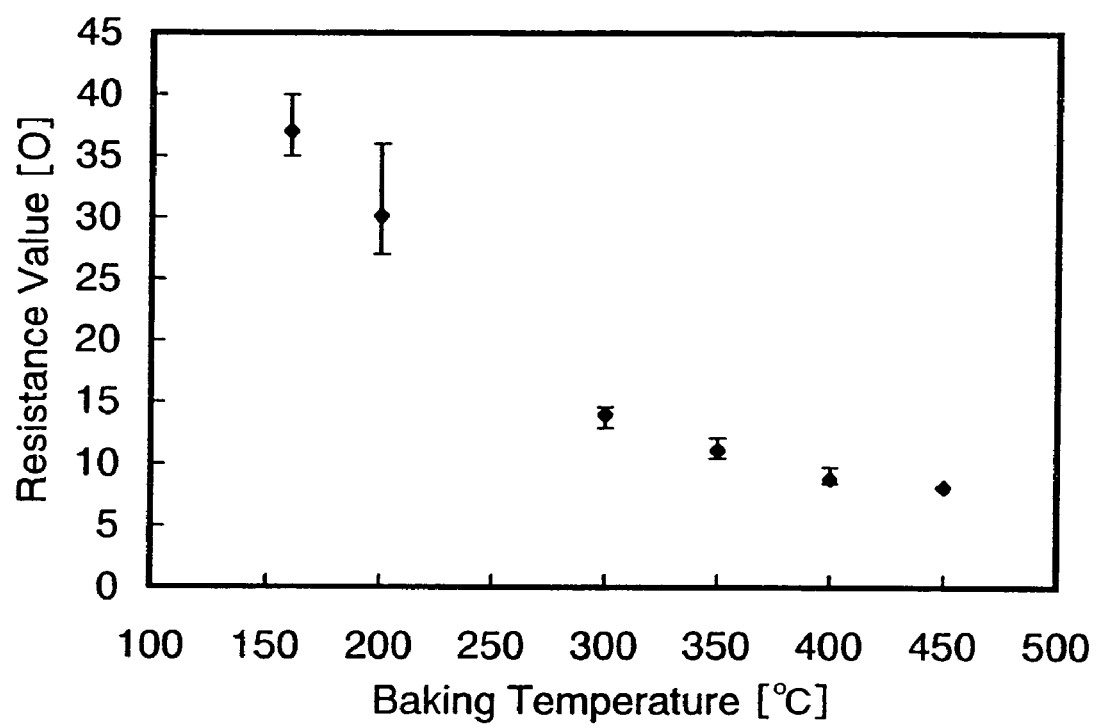
FIG. 8 is a chart for showing the relation between a heating temperature and the resistance of a conductive layer of the present invention.

In this embodiment, over a flexible substrate having a functional layer that has a conductive layer serving as an antenna and an insulating layer, a baking temperature for forming the conductive layer, the resistance of the conductive layer, and the probability that peeling is possible are shown with the use of FIG. 8 and Table 1.

A surface of a substrate was irradiated with a UV light plasma to remove contaminants from the surface of the substrate. After a silane coupling agent was deposited onto the substrate, a surface of the silane coupling agent was cleaned with ethanol and pure water, and a layer in which oxygen and silicon are combined and an inactive group is combined with the silicon was formed. Subsequently, a composition that contains particles with a metal element was applied in the shape of a coil, and baking was performed to form a conductive layer. Then, an insulating layer was formed over the layer in which oxygen and silicon are combined and an inactive group is combined with the silicon and the conductive layer. A functional layer formed of the conductive layer and the insulating layer was peeled through with the use of an adhesive.

Here, fluoroalkyl silane was used as a silane coupling agent. After the substrate was heated for 10 minutes at 170° C. and fluoroalkyl silane was deposited onto the surface of the substrate, the surface was cleaned with ethanol and pure water to form a layer in which oxygen and silicon are combined and an inactive group is combined with the silicon with a thickness of several nm to several tens of nm.

Further, as the composition that contains particles with a metal element, a composition containing silver particles was used. This composition was applied by a printing method, and heating was performed for 30 minutes at 160° C., 200° C., 300° C., 350° C., or 400° C. to form a conductive layer with a thickness of 30 μm.

As the insulating layer, an epoxy resin was applied by a printing method, and heating was performed for 30 minutes at 160° C. to bake the epoxy resin that has a thickness of 30 μm.

As the adhesive, an adhesive tape was used.

It is to be noted that a substrate over which the composition containing silver particles was baked at a temperature of 160° C. was a PEN substrate, and a substrate over which the composition containing silver particles was baked at a temperature of 200 to 400° C. was a glass substrate. Further, by setting the number of samples for each heating temperature to be 10, an experiment was carried out.

The average value of the resistance of the conductive layer with respect to the baking temperature at this time and the probability that peeling is possible are shown in Table 1, and graph for showing the relation between a baking temperature and the resistance of the conductive layer is shown in FIG. 8.

TABLE 1

| Sample number | Resitance Value [O] Baking Temperature [° C.] | | | | | |
|---|---|---|---|---|---|---|
| | 160 | 200 | 300 | 350 | 400 | 450 |
| 1 | 36 | 29 | 13.9 | 11.5 | 8.74 | 7.8 |
| 2 | 36 | 28 | 13.5 | 10.2 | 8.75 | 9.1 |
| 3 | 36 | 31 | 14.2 | 10.8 | 8.8 | 8.2 |
| 4 | 35 | 34 | 13.9 | 11 | 8.46 | 7.8 |
| 5 | 37 | 36 | 14.1 | 10.5 | 8.15 | 7.8 |
| 6 | 38 | 27 | 14.6 | 10.1 | 8.36 | 7.9 |
| 7 | 40 | 29 | 13.8 | 11.9 | 8.8 | 8.9 |
| 8 | 38 | 29 | 12.9 | 11.5 | 8.9 | 8.3 |
| 9 | 37 | 28 | 14.5 | 11.9 | 9.3 | 7.8 |
| 10 | 37 | 30 | 14.2 | 11.6 | 9.8 | 7.9 |
| Average Value | 37 | 30.1 | 13.96 | 11.1 | 8.806 | 8.15 |
| Provability for peeling (%) | 100 | 100 | 100 | 50 | 0 | 0 |

According to Table 1, a baking temperature at which peeling is possible was less than 400° C., preferably 350° C. or less. According to FIG. 8, the resistance of the conductive layer serving as an antenna was 30Ω or less. Thus, in accordance with this embodiment, it was found that the range of a heating temperature at which a functional layer having a conductive layer that serves as an antenna can be peeled was greater than or equal to 200° C. and less than or equal to 350° C., preferably greater than or equal to 200° C. and less than or equal to 300° C.

That is, a layer having functionality is peeled from the substrate, which is formed by heating at a temperature of greater than or equal to 200° C. and less than or equal to 350° C., preferably greater than or equal to 200° C. and less than or equal to 300° C. over a substrate having heat resistance, whereby a layer having functionality can be easily formed.

Embodiment 2

In this embodiment, a manufacturing step of a semiconductor device capable of transmitting and receiving data wirelessly will be explained with reference to FIGS. 9A to 9E, FIGS. 10A to 10D, and FIGS. 11A to 11C.

As shown in FIG. 9A, a peeling layer 202 is formed over a substrate 201, an insulating layer 203 is formed thereover, and a thin film transistor 204 and an interlayer insulating layer 205 that insulates a conductive layer forming a thin film transistor are formed thereover. In order to be connected to a semiconductor layer of the thin film transistor, a source electrode and a drain electrode 206 are formed. Then, an insulating layer 207 is formed, which covers the thin film transistor 204, the interlayer insulating layer 205, and the source electrode and the drain electrode 206. A conductive layer 208 that is connected to the source electrode or the drain electrode 206 through the insulating layer 207 is formed.

As the substrate 201, a glass substrate, a quartz substrate, a metal or stainless steel substrate with an insulating layer formed over one surface, a plastic substrate that has enough heat resistance to resist a treatment temperature of this step, or the like is used. Since the aforementioned substrate 201 is not limited in size or shape, a rectangular substrate with a length of 1 m or more on one side, for example, can be used to drastically increase productivity. This point is a superior to that of a circular silicon substrate.

The peeling layer 202 is formed by a sputtering method, a plasma CVD method, a coating method, a printing method, or the like to be a single layer or a stacked layer made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); an alloy material containing the element as its main component; or a compound material containing the element as its main component. The crystalline structure of a layer containing silicon may be amorphous, microcrystalline, or polycrystalline.

In a case where the peeling layer 202 has a single layer structure, a tungsten layer, a molybdenum layer, or a layer containing a mixture of tungsten and molybdenum is preferably formed. Alternatively, a layer containing tungsten oxide or tungsten oxynitride, a layer containing molybdenum oxide or molybdenum oxynitride, or a layer containing oxide of a mixture of tungsten and molybdenum or oxynitride of a mixture of tungsten and molybdenum is formed. It is to be noted that the mixture of tungsten and molybdenum corresponds to an alloy of tungsten and molybdenum.

In a case where the peeling layer 202 has a stacked layer structure, a tungsten layer, a molybdenum layer, or a layer containing a mixture of tungsten and molybdenum is preferably formed as a first layer. Oxide of tungsten, molybdenum, or a mixture of tungsten and molybdenum; nitride of tungsten, molybdenum, or a mixture of tungsten and molybdenum; oxynitride of tungsten, molybdenum, or a mixture of tungsten and molybdenum; or nitride oxide of tungsten, molybdenum, or a mixture of tungsten and molybdenum is preferably formed as a second layer.

In a case where a stacked layer structure of a layer containing tungsten and a layer containing tungsten oxide is formed as the peeling layer 202, the layer containing tungsten is formed, and an insulating layer formed from oxide is formed thereover, and a layer containing tungsten oxide in an interface between the tungsten layer and the insulating layer is formed, which may be utilized. Moreover, a surface of the layer containing tungsten may be subjected to thermal oxidation treatment, oxygen plasma treatment, $N_2O$ plasma treatment, treatment using a solution having strong oxidizability such as ozone water, or the like, thereby forming the layer containing tungsten oxide. A case of forming a layer containing tungsten nitride, a layer containing tungsten oxynitride, or a layer containing tungsten nitride oxide is similar to the above. After forming the layer containing tungsten, a silicon nitride layer, a silicon oxynitride layer, and a silicon nitride oxide layer may be formed.

Tungsten oxide is represented by WOx where x is in the range of $2 \leq x \leq 3$. The x may be 2 ($WO_2$), 2.5 ($W_2O_5$), 2.75 ($W_4O_{11}$), 3 ($WO_3$), and the like.

Although the peeling layer 202 is formed in contact with the substrate 201 in accordance with the above step, the present invention is not limited to this step. An insulating layer to be a base may be formed so as to be in contact with the substrate 201, and the peeling layer 202 may be provided in contact with the insulating layer.

The insulating layer 203 is formed using an inorganic compound by a sputtering method, a plasma CVD method, a coating method, a printing method, or the like to be a single layer or a stacked layer. As a typical example of an inorganic compound, oxidized silicon or nitrided silicon can be given. Moreover, the insulating layer 203 may be formed to have a stacked layer structure. For example, layers may be stacked using an inorganic compound. Typically, silicon oxide, silicon nitride oxide, and silicon oxynitride may be stacked to form the insulating layer 203.

The thin film transistor 204 includes a semiconductor layer having a source region, a drain region, and a channel formation region; a gate insulating layer; and a gate electrode.

The semiconductor layer is formed from a semiconductor having a crystalline structure, and a non-single crystalline semiconductor or a single crystalline semiconductor may be used. In particular, a crystalline semiconductor that is crystallized by heat treatment or a crystalline semiconductor that is crystallized by combining heat treatment and irradiation of laser light is preferably applied. During heat treatment, a crystallization method can be applied using a metal element such as nickel that operates to promote crystallization of a silicon semiconductor. Further, by heating during the crystallization step of the silicon semiconductor, a surface of the peeling layer can be oxidized to form a metal oxidized layer in the interface between the peeling layer 202 and the insulating layer 203.

In a case where crystallization is performed by irradiation of laser light in addition to heat treatment, the crystallization can be performed by using continuous wave laser light or ultra short pulsed laser light with a repetition rate of 10 MHz or higher and the pulse width of 1 nanosecond or shorter, preferably 1 to 100 picoseconds, in such a way that a melting zone in which the crystalline semiconductor is melted is moved continuously in a direction of irradiation of the laser light. By such a crystallization method, a crystalline semiconductor that has a large grain size with a crystal grain boundary extending in one direction can be obtained. By matching a carrier drifting direction to the direction where the crystal grain boundary is extended, the electric field effect mobility of the transistor can be increased. For example, a mobility of 400 $cm^2$/V·sec or higher can be achieved.

In a case where a crystallization process at a heat-resistance temperature (approximately 600° C.) or lower of the glass substrate is used for the above crystallization step, a glass substrate having a large size can be used. Therefore, a large quantity of semiconductor devices can be manufactured per substrate, and costs can be reduced.

Further, the semiconductor layer may be formed by performing a crystallization step by heating at a temperature of heat resistance of the glass substrate or higher. Typically, a quartz substrate is used for the substrate 201, and an amorphous or microcrystalline semiconductor is heated at 700° C. or more, thereby forming the semiconductor layer. As a result, a semiconductor having high crystallinity can be formed. Therefore, a thin film transistor of which properties such as a response speed and mobility are favorable and which is capable of high speed operation can be provided.

The gate insulating layer is formed from an inorganic insulator such as silicon oxide and silicon oxynitride.

The gate electrode can be formed from a polycrystalline semiconductor to which metal or an impurity of one conductivity type is added. In a case of using metal, tungsten (W), molybdenum (Mo), titanium (Ti), tantalum (Ta), aluminum (Al), or the like can be used. Metal nitride formed by nitriding metal may be also used. Alternatively, the gate electrode may have a structure in which a first layer made of the metal nitride and a second layer made of the metal are stacked. In a case of the stacked layer structure, an edge portion of the first layer may be projected beyond an edge portion of the second layer. At this time, by forming the first layer from metal nitride, a barrier metal can be obtained. In other words, the metal of the second layer can be prevented from diffusing into the gate insulating layer or into the semiconductor layer that is provided in the lower part of the gate insulating layer.

Various structures such as a single drain structure, an LDD (lightly-doped drain) structure, and a gate-overlapped drain structure can be applied to the thin film transistor that is formed by combining the semiconductor layer, the gate insulating layer, the gate electrode, and the like. Here, a thin film transistor having a single drain structure is employed. Moreover, a multi-gate structure where transistors, to which a gate voltage having the same potential is applied equally are serially connected, a dual-gate structure where the semiconductor layer is sandwiched by the gate electrode, an inversely staggered thin film transistor where the gate electrode is formed over the insulating layer 203 and the gate insulating layer and the semiconductor layer are formed thereover, or the like can be applied.

The source electrode and drain electrode 206 are preferably formed by combining a low-resistance material such as aluminum (Al), a barrier metal using a metal material that has a high melting point such as titanium (Ti) or molybdenum (Mo) to have a stacked-layer structure of titanium (Ti) and aluminum (Al), or a stacked-layer structure of molybdenum (Mo) and aluminum (Al), or the like.

The interlayer insulating layer 205 and the insulating layer 207 are formed using polyimide, acryl, or siloxane polymer.

Furthermore, a semiconductor element of any structure may be provided instead of the thin film transistor 204 as long as the semiconductor element serves as a switching element. As a typical example of the switching element, MIM (Metal-Insulator-Metal), a diode, or the like can be given.

Next, as shown in FIG. 9B, a conductive layer 211 is formed over the conductive layer 208. Here, a composition that contains gold particles is printed by a printing method, and then, heating is performed for 30 minutes at 200° C. to bake the composition, thereby forming the conductive layer 211.

Subsequently, as shown in FIG. 9C, an insulating layer 212 for covering the insulating layer 207 and an edge portion of the conductive layer 211 is formed. Here, after applying an epoxy resin by a spin coating method, the epoxy resin is heated for 30 minutes at 160° C. Then, the insulating layer in a portion where the conductive layer 211 is covered is removed to expose the conductive layer 211 and the insulating layer 212 is also formed. Here, a stacked body including the insulating layer 203 to the insulating layer 212 is referred to as an element formation layer 210.

Then, as shown in FIG. 9D, in order to perform a subsequent peeling step easily, the insulating layers 203, 205, 207, and 212 are irradiated with laser light 213 to form an opening 214 as shown in FIG. 9E. Subsequently, an adhesive 215 is attached to the insulating layer 212. As the laser light used for forming the opening 214, laser light having a wavelength that is absorbed by the insulating layers 203, 205, 207, and 212 is preferably used. Typically, laser light in a UV region, a visible region, or an infrared region is appropriately selected for irradiation.

As a laser oscillator capable of oscillating such laser light, an oscillator of an excimer laser such as an ArF laser, a KrF laser, or a XeCl laser; a gas laser such as a He laser, a He—Cd laser, an Ar laser, a He—Ne laser, a HF laser, or a $CO_2$ laser; a solid laser such as a crystal laser in which a crystal such as YAG, $GdVO_4$, $YVO_4$, YLF, or $YAlO_3$ is doped with Cr, Nd, Er, Ho, Ce, Co, Ti, or Tm, a glass laser, or a ruby laser; or a semiconductor laser such as a GaN laser, a GaAs laser, a GaAlAs laser, or an InGaAsP laser can be used. In the solid laser oscillator, the fundamental wave to the fifth harmonic wave may be appropriately used. As a result, the insulating layers 203, 205, 207, and 212 absorb and melt laser light to form the opening.

By eliminating the step of irradiating the insulating layers 203, 205, 207, and 212 with laser light, throughput can be improved.

Figure 10A:
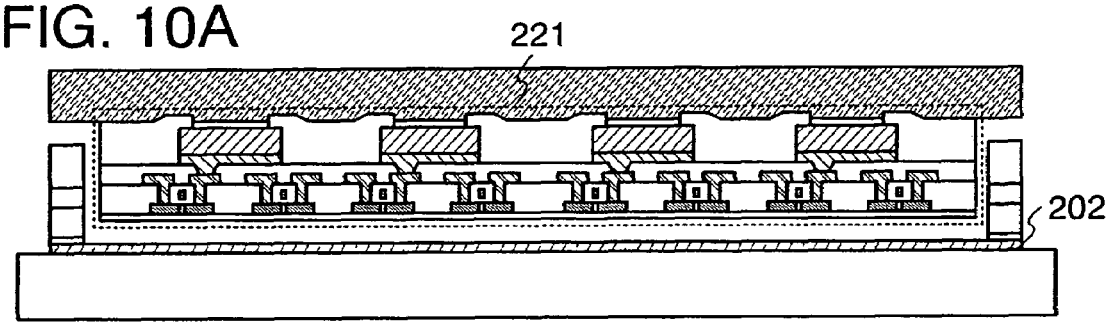
FIGS. 10A to 10D are cross-sectional views for each showing a manufacturing step of a semiconductor device of the present invention.

Next, as shown in FIG. 10A, a part 221 of the element formation layer is peeled from the substrate 201 having the peeling layer by a physical means by dividing a metal oxide layer formed in the interface between the peeling layer 202 and the insulating layer 203. The physical means refers to a dynamic means or a mechanical means, which changes some dynamic energy (mechanical energy). The typical physical means refers to mechanical power addition (for example, peeling by a human hand or grip tool, or separation treatment by rolling a roller).

In this embodiment, a method in which the metal oxide film is formed between the peeling layer and the insulating layer, and the element formation layer 210 is peeled by a physical means by dividing the metal oxide film, is used; however, the present invention is not limited thereto. A method can be used, in which, by using a substrate that has a light transmitting property for the substrate and using an amorphous silicon layer containing moisture for the peeling layer, irradiation of laser light from a substrate side is performed to vaporize moisture contained in the amorphous silicon film after the step of FIG. 9E, and peeling between the substrate and the peeling layer is performed.

Further, after the step of FIG. 9E, a method for removing the substrate by mechanically grinding the substrate or a method for removing the substrate using a solution for dissolving a substrate, such as HF, can be used. In this case, the peeling layer may be unused.

In FIG. 9E, the following method can be used: a fluoride halogen gas such as $NF_3$, $BrF_3$, or $ClF_3$ is introduced into the opening 214 before attaching the adhesive 215 to the insulating layer 212; after etching the peeling layer with a fluoride halogen gas, the adhesive 215 is attached to the insulating layer 212; and the element formation layer 210 is peeled from the substrate.

In FIG. 9E, the following method can be also used: a fluoride halogen gas such as $NF_3$, $BrF_3$, or $ClF_3$ is introduced into the opening 214 before attaching the adhesive 215 to the insulating layer 212; after etching part of the peeling layer with a fluoride halogen gas, the adhesive 215 is attached to the insulating layer 212; and the element formation layer 210 is peeled from the substrate by a physical means.

Next, as shown in FIG. 10A, the part 221 of the element formation layer is peeled from the peeling layer 202.

Figure 10B:
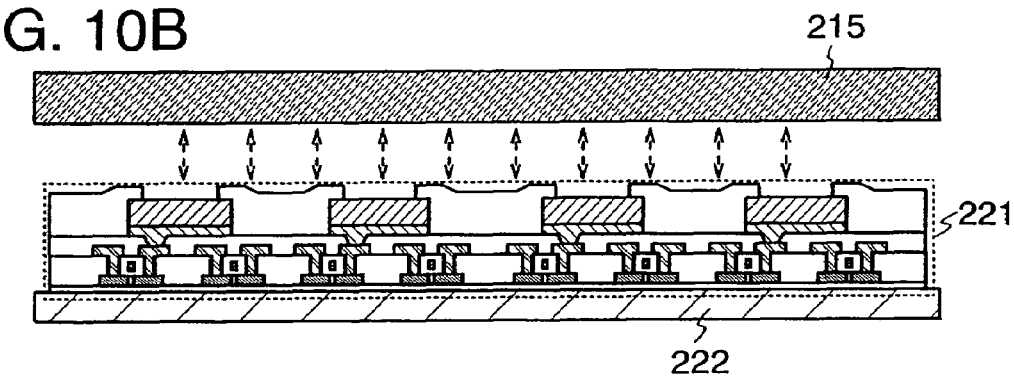

Subsequently, as shown in FIG. 10B, a flexible substrate 222 is attached to the insulating layer 203 in the part 221 of the element formation layer. Thereafter, the adhesive 215 is peeled from the part 221 of the element formation layer.

Figure 10C:
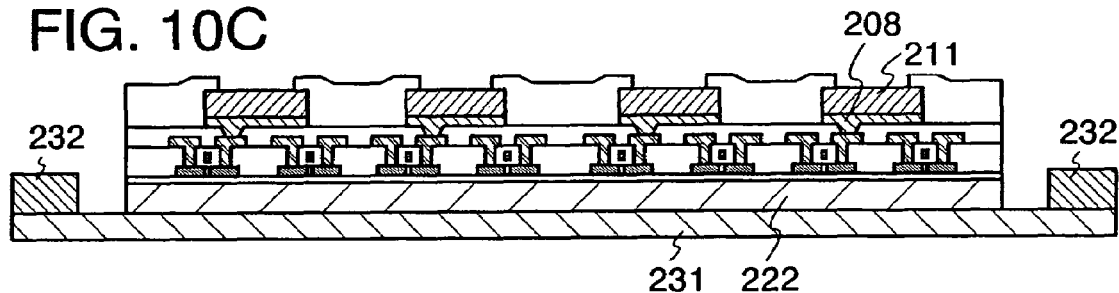

Then, as shown in FIG. 10C, the flexible substrate 222 is attached to a UV tape 231 of a dicing frame 232. Since the UV tape 231 has adhessiveness, the flexible substrate 222 is fixed over the UV tape 231. Thereafter, the conductive layer 211 is irradiated with laser light to enhance adhesion between the conductive layer 211 and the conductive layer 208.

Figure 10D:
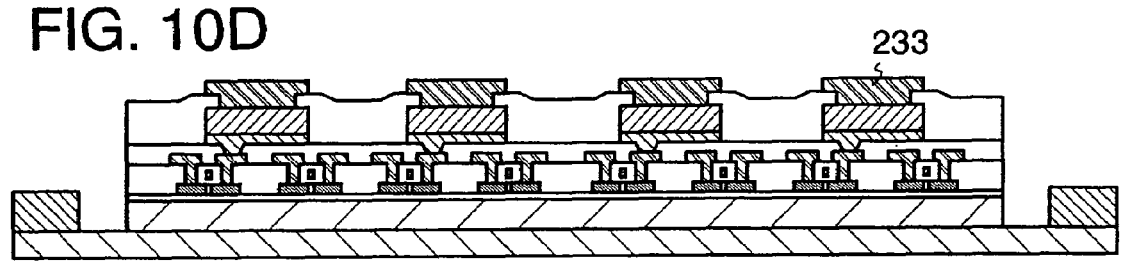

Subsequently, as shown in FIG. 10D, a connection terminal 233 is formed over the conductive layer 211. By forming the connection terminal 233, alignment with and attachment to a conductive layer serving as an antenna afterwards can be easily performed.

Figure 11A:
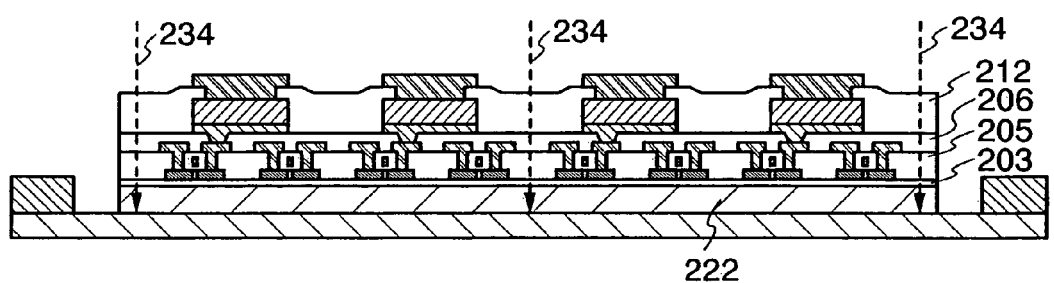
FIGS. 11A to 11C are cross-sectional views for each showing a manufacturing step of a semiconductor device of the present invention.
Figure 11B:
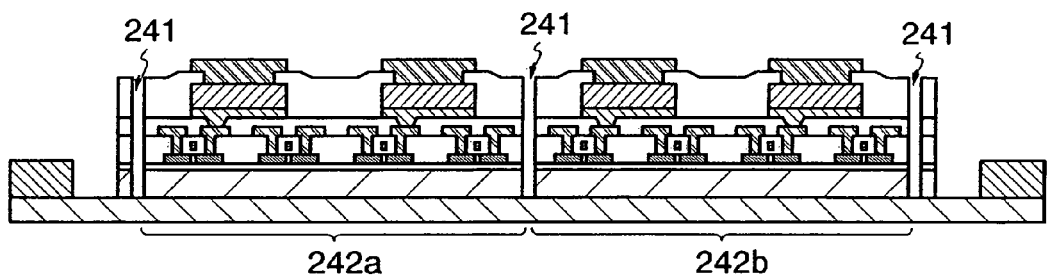
Figure 11C:
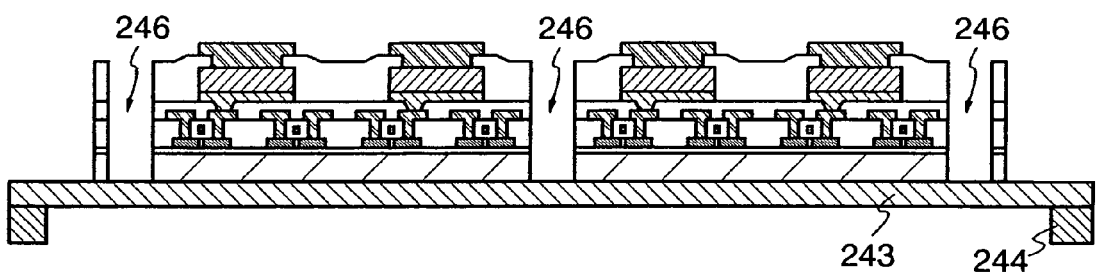

Next, as shown in FIG. 11A, the part 221 of the element formation layer is divided into parts. Here, the part 221 of the element formation layer and the flexible substrate 222 are irradiated with laser light 234 to form a groove 241 as shown in FIG. 11A, thereby dividing the part 221 of the element formation layer into a plurality. As for the laser light 234, the laser light that is described for the laser light 231 can be applied by being appropriately selected. Laser light that can be absorbed by the insulating layers 203, 205, 206, and 212 and the flexible substrate 222 is preferably selected. Although the part of the element formation layer is divided into a plurality by using a laser cut method here, a dicing method, a scribing method, or the like can be appropriately used instead of this method. As a result, the divided element formation layer is referred to as thin film integrated circuits 242a and 242b.

Subsequently, a UV sheet of the dicing frame 232 is irradiated with UV light to lower the adhesiveness of the UV sheet, and then, the thin film integrated circuits 242a and 242b are attached to an adhesive sheet 243 of an expander frame 244. At this time, the adhesive sheet 243 is attached to the thin film integrated circuits 242a and 242b while being extended, whereby the width of the groove 241 formed between the thin film integrated circuits 242a and 242b can be expanded. It is to be noted that the expanded groove 246 preferably corresponds to the size of an antenna substrate attached to the thin film integrated circuits 242a and 242b in a subsequent step.

Figure 12A:
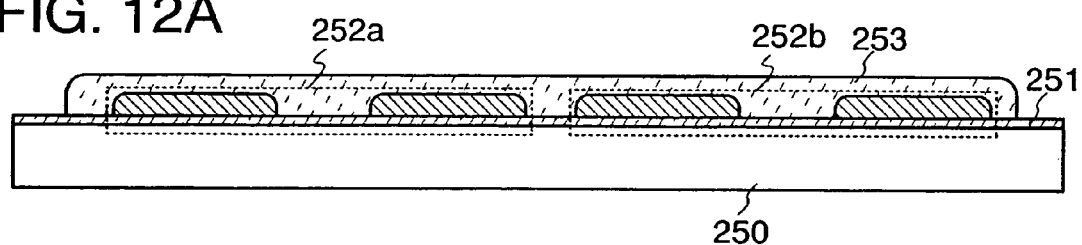
FIGS. 12A to 12D are cross-sectional views for each showing a manufacturing step of a semiconductor device of the present invention.

Next, a flexible substrate having a conductive layer serving as an antenna is manufactured. First, as shown in FIG. 12A, a silane coupling agent is applied to a substrate 250, thereby forming a layer 251 in which oxygen and silicon are combined and an inactive group is combined with the silicon. Then, conductive layers 252a and 252b serving as antennas are formed thereover, and an insulating layer 253 for covering the conductive layers 252a and 252b is formed.

Here, a glass substrate is used as the substrate 250, and fluoroalkyl silane is used as for the layer 251 in which oxygen and silicon are combined and an inactive group is combined with the silicon. The substrate 250 is heated for 10 minutes at 170° C. to deposit fluoroalkyl silane onto a surface of the substrate, and then, the surface is cleaned with ethanol and pure water to form a layer in which oxygen and silicon are combined and an inactive group is combined with the silicon with a thickness of several nm to several tens of nm. As the conductive layers 252a and 252b, a composition containing silver particles is applied by a printing method, and the composition is heated for 30 minutes at 300° C. and baked to form a conductive layer with a thickness of 30 μm. As the insulating layer 253, an epoxy resin is applied by a printing method, and the resin is heated for 30 minutes at 160° C. and baked to form the insulating layer 253 with a thickness of 30 μm.

Figure 14A:
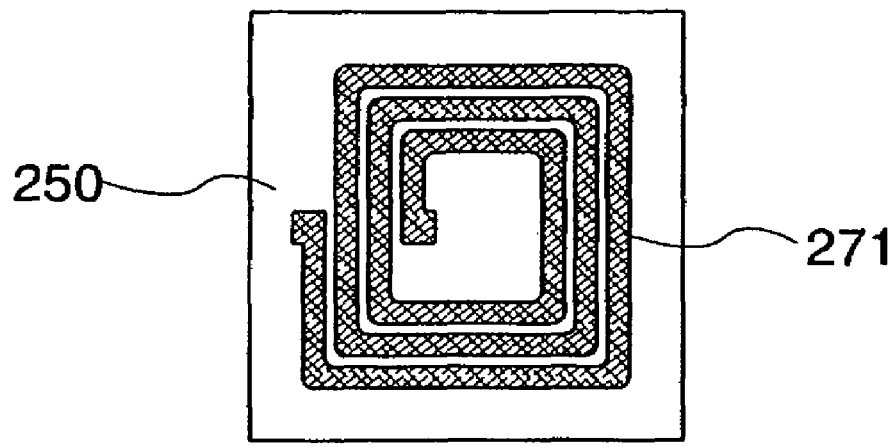
FIGS. 14A to 14C are top views for each showing a structure of an antenna that can be applied to the present invention.
Figure 14B:
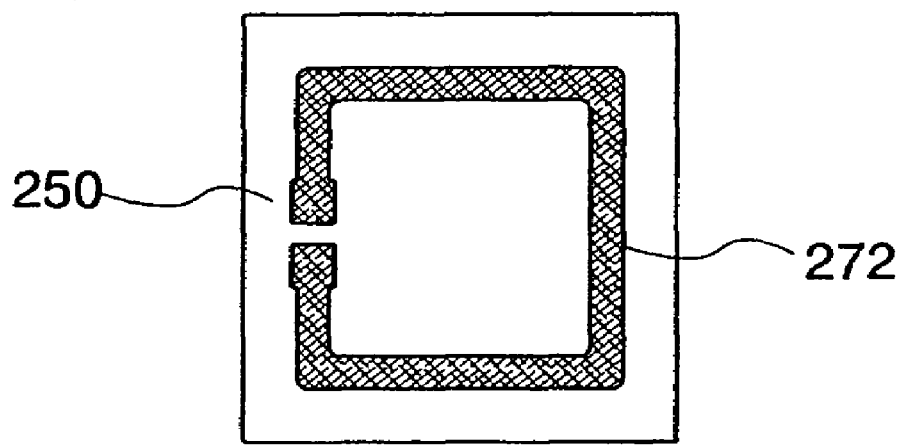

As a shape of the conductive layer serving as an antenna at this time, in a case where an electromagnetic coupling system or an electromagnetic induction system (for example, a frequency of 13.56 MHz) is used as a transmission system of a signal in a semiconductor device, electromagnetic induction due to the change of magnetic field density is utilized; therefore, the conductive layer serving as an antenna can be formed to have a square coil shape 271 as shown in FIG. 14A or a circular coil shape (for example, a spiral antenna). Further, the conductive layer serving as an antenna can be formed to have a square loop shape 272 as shown in FIG. 14B or a circular loop shape.

Figure 14C:
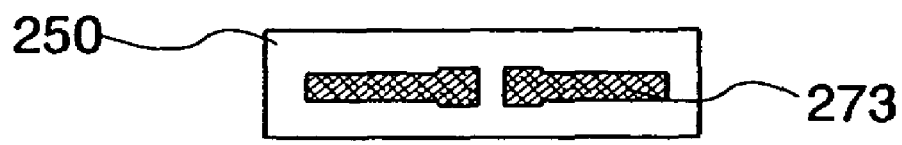

In a case where a microwave system (for example, the UHF band (a frequency of 860 to 960 MHz) or a frequency of 2.45 GHz) is used, the shape such as the length of the conductive layer serving as an antenna may be appropriately set in consideration of the wavelength of an electromagnetic wave used for the transmission of the signal. The conductive layer serving as an antenna can be formed to have a line dipole shape 273 as shown in FIG. 14C, a curved dipole shape, or a planar shape (for example, a patch antenna).

Figure 12B:
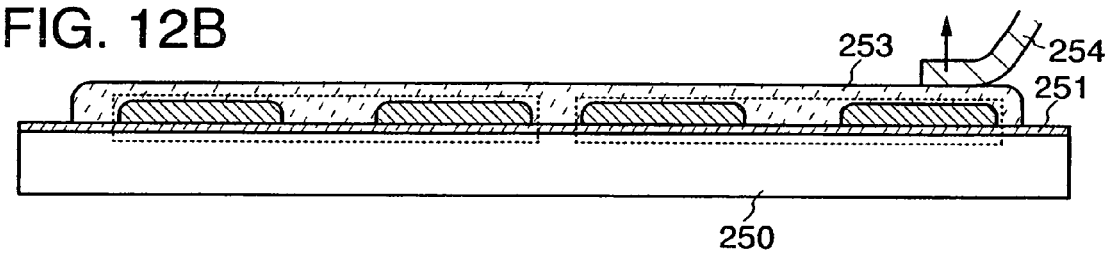
Figure 12C:
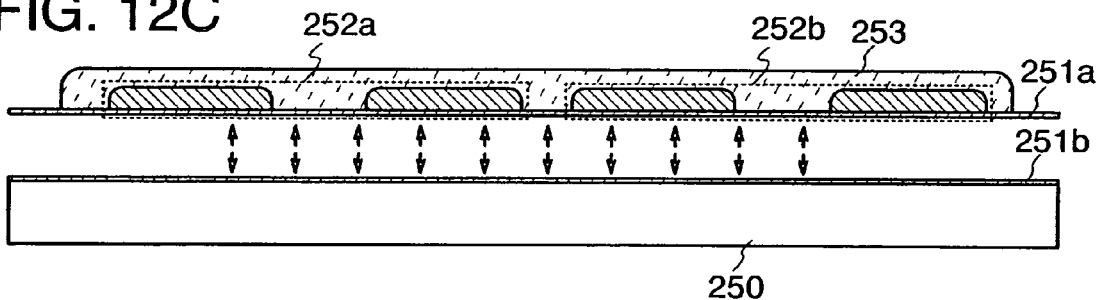

Next, as shown in FIG. 12B, an adhesive 254 is attached to the insulating layer 253, and then, the adhesive 254 is pulled up. As a result, as shown in FIG. 12C, the layer in which oxygen and silicon are combined and an inactive group is combined with the silicon is divided, and the conductive layers 252a and 252b and the insulating layer 253 are peeled from the substrate 250. At this time, a part 251b of the layer in which oxygen and silicon are combined and an inactive group is combined with the silicon remains over the substrate 250, and a part 251a of the layer in which oxygen and silicon are combined and an inactive group is combined with the silicon remains over a surface of the conductive layers 252a and 252b and the insulating layer 253.

Figure 12D:
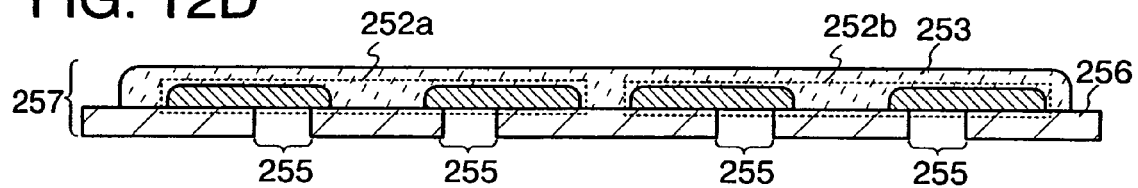

Then, as shown in FIG. 12D, after removing the part of the layer in which oxygen and silicon are combined and an inactive group is combined with the silicon that remains over a surface of the conductive layers 252a and 252b and the insulating layer 253, the conductive layers 252a and 252b and the insulating layer 253 are attached to a flexible substrate 256 where openings 255 are formed. At this time, alignment of the flexible substrate 256 and the conductive layers 252a and 252b is performed so as to expose part of the conductive layers 252a and 252b through the openings 255.

Through the above step, a flexible substrate 257 that has the conductive layers 252a and 252b serving as antennas is formed.

Next, as shown in FIG. 13A, the flexible substrate 257 that has the conductive layers 252a and 252b serving as antennas and the thin film integrated circuits 242a and 242b are attached to each other with the use of anisotropic conductive adhesive agents 255a and 255b. At this time, attachment is performed while aligning so as to connect the conductive layers 252a and 252b serving as antennas to the connection terminal of the thin film integrated circuits 242a and 242b with conductive particles 254a and 254b contained in the anisotropic conductive adhesive agents 255a and 255b.

Here, the conductive layer 252a serving as an antenna and the thin film integrated circuit 242a are connected to each other through the conductive particle 254a in the anisotropic conductive adhesive agent 255a. The conductive layer 252b serving as an antenna and the thin film integrated circuit 242b are connected to each other through the conductive particle 254b in the anisotropic conductive adhesive agent 255b.

Subsequently, as shown in FIG. 13B, the thin film integrated circuit connected to the flexible circuit 257 is divided in a region where the conductive layers 252a and 252b serving as antennas and the thin film integrated circuits 242a and 242b are not formed. Here, division is carried out by a laser cut method in which the insulating layer 253 and the flexible substrate 256 are irradiated with laser light 256.

Through the above step, as shown in FIG. 13C, semiconductor devices 262a and 262b capable of transmitting and receiving data wirelessly can be manufactured.

It is to be noted that the following step may be performed: the flexible substrate 256 that has the conductive layers 252a and 252b serving as antennas and the thin film integrated circuits 242a and 242b are attached to each other with the use of the anisotropic conductive adhesive agents 255a and 255b as shown in FIG. 13A; a flexible substrate is provided to seal the flexible substrate 256 and the thin film integrated circuits 242a and 242b; the region where the conductive layers 252a and 252b serving as antennas and the thin film integrated circuits 242a and 242b are not formed is irradiated with the laser light 261 as shown in FIG. 13B; and a semiconductor device 264 as shown in FIG. 13D is manufactured. In this case, the thin film integrated circuit is sealed by the flexible substrate 256 and a flexible substrate 263 that are divided, whereby deterioration of the thin film integrated circuit can be suppressed.

By the above step, a semiconductor device that is thin and lightweight can be manufactured with a high yield.

Embodiment 3

Figure 16:
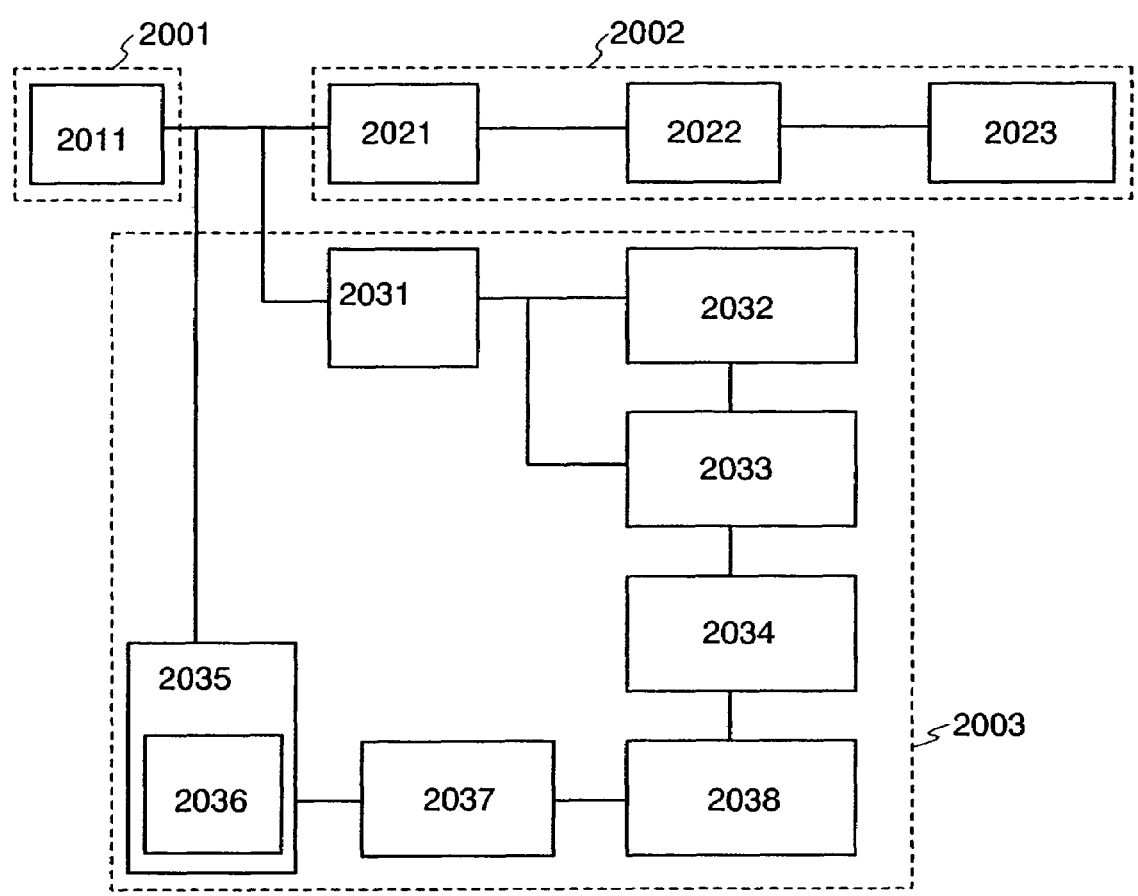
FIG. 16 is a view for showing a structure of a semiconductor device of the present invention.

A structure of the semiconductor device capable of transmitting and receiving data wirelessly of the above embodiment will be explained with reference to FIG. 16.

A semiconductor device of this embodiment is mainly formed by an antenna portion 2001, a power supply portion 2002, and a logic portion 2003.

The antenna portion 2001 is made of an antenna 2011 for receiving an external signal and transmitting data. As for a signal transmission system in the semiconductor device, an electromagnetic coupling system, an electromagnetic induction system, a microwave system, or the like can be used. The transmission system may be appropriately selected by a practitioner considering the use application. The most suitable antenna may be provided in accordance with the transmission system.

The power supply portion 2002 is made of a rectification circuit 2021 for making a power supply by a signal received from an external portion through the antenna 2011, a storage capacitor 2022 for storing the electric power supply that is made, and a constant voltage circuit 2023 for making a constant voltage that is supplied to each circuit.

The logic portion 2003 includes a demodulation circuit 2031 for demodulating a signal that is received, a clock generation and compensation circuit 2032 for generating a clock signal, a circuit 2033 for recognizing and determining each code, a memory controller 2034 for making a signal for reading data from a memory by the received signal, a modulation circuit 2035 for transmitting an encode signal to the received signal, an encode circuit 2037 for encoding data that is read out, and a mask ROM 2038 for storing data. It is to be noted that the modulation circuit 2035 includes a modulation resistor 2036.

As a code that is recognized and determined by the circuit 2033 for recognizing and determining each code, an end of frame (EOF) signal, a start of frame (SOF) signal, a flag, a command code, a mask length, a mask value, and the like are given. Further, the circuit 2033 for recognizing and determining each code includes a cyclic redundancy check (CRC) function for identifying a transmission error.

In the semiconductor device of this embodiment, an antenna that has little variation in inductance from among a plurality of antennas that are formed at the same time can be used. In addition, an antenna having high electromotive force can be used. As a result, a semiconductor device that has little variation can be manufactured. Further, through use of a functional layer that is formed over a flexible substrate, a semiconductor device that is small-sized, thin, and lightweight can be achieved.

Embodiment 4

Figure 17A:
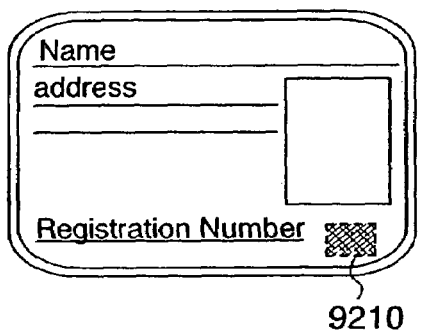
FIGS. 17A to 17F are views for each showing an application example of a semiconductor device of the present invention.
Figure 17B:
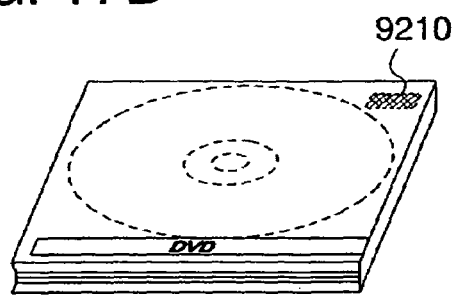
Figure 17C:
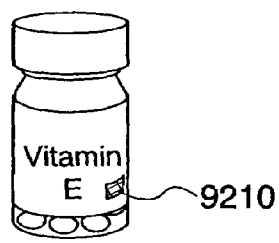
Figure 17D:
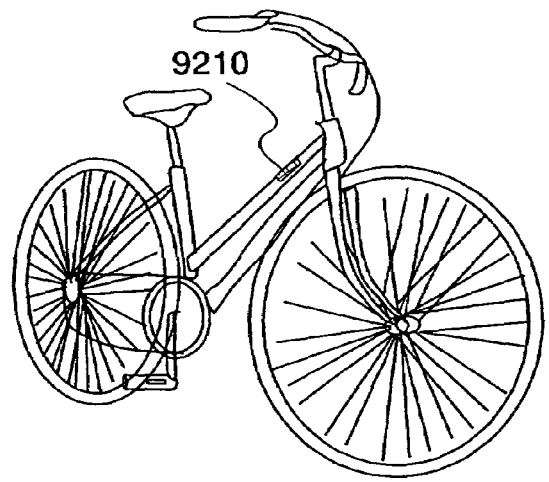
Figure 17E:
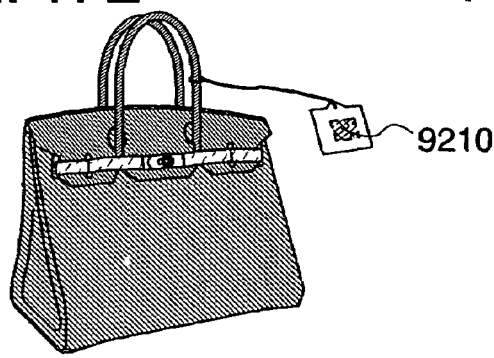
Figure 17F:
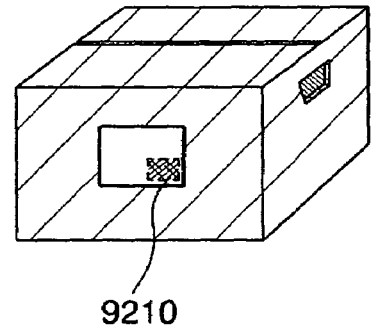

The semiconductor device capable of transmitting and receiving data wirelessly as shown above is acceptable for a wide range of products. For example, the semiconductor device can be applied to bills, coins, securities, bearer bonds, identification certificates (a driver's license, a certificate of residence, and the like, see FIG. 17A), containers for package (wrapping paper, bottles, and the like, see FIG. 17C), recording media (DVD software, video tapes, and the like, see FIG. 17B), vehicles (bicycles and the like, see FIG. 17D), personal belongings (bags, glasses, and the like), foods, plants, animals, human bodies, clothes, commodities, electronic appliances, baggage tags (see FIGS. 17E and 17F), and the like. The electronic appliances include a liquid crystal display device, an EL display device, a television device (also referred to as simply a TV, a TV receiver, or a television receiver), a cellular phone, and the like.

A semiconductor device 9210 of this embodiment is fixed to a product by being mounted on a printed substrate, attached to a surface of the product, or embedded inside the product. For example, if the product is a book, the semiconductor device 9210 is fixed to the book by embedding it inside the paper, and if the product is a package made from an organic resin, the semiconductor device 9210 is fixed to the package by embedding it inside the organic resin. Since the semiconductor device 9210 of this embodiment can achieve a device that is small-sized, thin, and lightweight, the design quality of the product itself is not degraded even after the semiconductor device is fixed to the product. By providing the semiconductor device 9210 in bills, coins, securities, bearer bonds, identification certificates, and the like, a certification function can be provided and forgery can be prevented through use of the certification function. Moreover, when the semiconductor device of this embodiment is provided in containers for package, recording media, personal belongings, foods, clothes, commodities, electronic appliances, and the like, systems such as an inspection system can become more efficient.

Embodiment 5

As an electronic appliance having the semiconductor device shown in Embodiment Modes 2 to 4, a television device (also referred to as simply TV or a television receiver), a camera such as a digital camera or a digital video camera, a cellular phone device (also referred to as simply cellular phone set or cellular phone), a portable information terminal such as a PDA, a portable game machine, a monitor for a computer, a computer, an audio reproducing device such as a car audio component, an image reproduction device provided with a recording medium such as a home game machine, and the like can be given. Specific examples thereof will be explained with reference to FIGS. 18A to 18F.

Figure 18A:
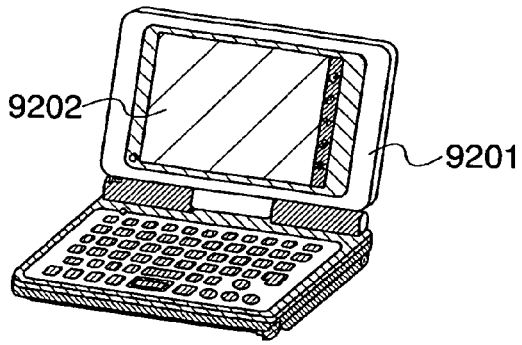
FIGS. 18A to 18F are views for each showing an electronic device including a semiconductor device of the present invention.

A portable information terminal shown in FIG. 18A includes a main body 9201, a display portion 9202, and the like. A display device using the flexible substrate shown in Embodiment Modes 2 to 4 can be applied to the display portion 9202. By using the display device as one aspect of the present invention, a lightweight and small-sized portable information terminal can be provided.

Figure 18B:
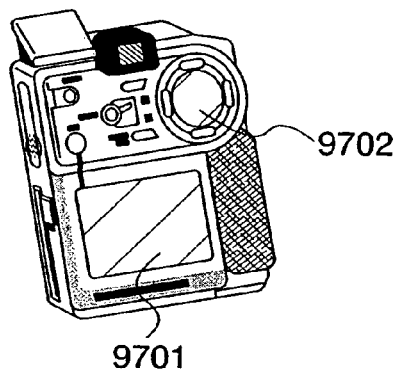

A digital video camera shown in FIG. 18B includes a display portion 9701, a display portion 9702, and the like. A display device using the flexible substrate shown in Embodiment Modes 2 to 4 can be applied to the display portion 9701. By using the display device as one aspect of the present invention, a small-sized digital video camera can be provided.

Figure 18C:
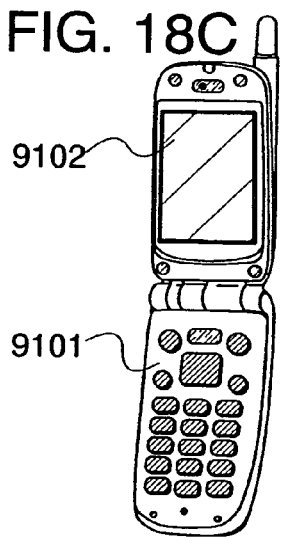

A portable terminal shown in FIG. 18C includes a main body 9101, a display portion 9102, and the like. A display device using the flexible substrate shown in Embodiment Modes 2 to 4 can be applied to the display portion 9102. By using the display device as one aspect of the present invention, a small-sized portable terminal can be provided.

Figure 18D:
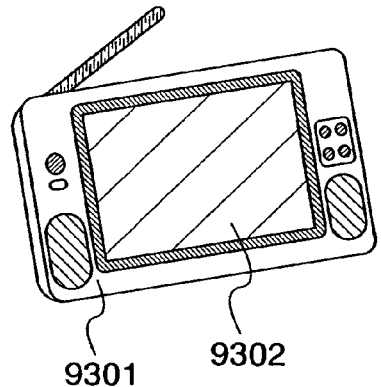

A portable television device shown in FIG. 18D includes a main body 9301, a display portion 9302, and the like. A display portion using the flexible substrate shown in Embodiment Modes 2 to 4 can be applied to the display portion 9302.

By using the display device as one aspect of the present invention, a small-sized and lightweight portable television device can be provided. Such a television device can be applied in a wide range to various televisions such as a small-sized one mounted in a portable terminal such as a cellular phone, a medium-sized one that is portable, and a large-sized one (e.g., one 40 inches or more in size).

Figure 18E:
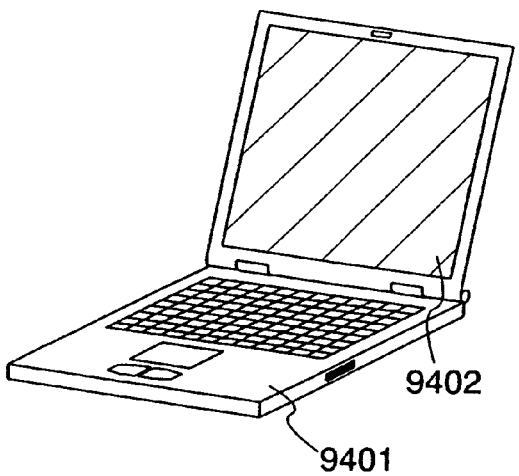

A portable computer shown in FIG. 18E includes a main body 9401, a display portion 9402, and the like. A display device using the flexible substrate shown in Embodiment Modes 2 to 4 can be applied to the display portion 9402. By using the display device as one aspect of the present invention, a lightweight and small-sized computer can be provided.

Figure 18F:
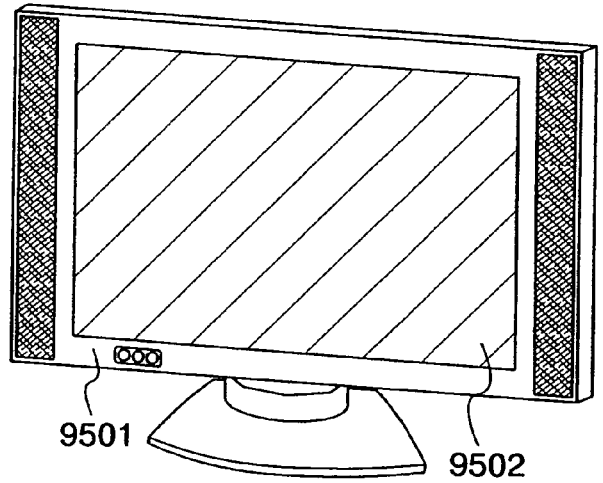

A television device shown in FIG. 18F includes a main body 9601, a display portion 9602, and the like. A display device using the flexible substrate shown in Embodiment Modes 2 to 4 can be applied to the display portion 9602. By using the display device as one aspect of the present invention, a small-sized television device can be provided.

This application is based on Japanese Patent Application serial no. 2005-327951 filed in Japan Patent Office on Nov. 11 in 2005, the entire contents of which are hereby incorporated by reference.

The invention claimed is:

1. A method for manufacturing a semiconductor device, comprising the steps of:
   forming a first peeling layer comprising a silane coupling agent over a first substrate;
   forming a first conductive layer over the first peeling layer;
   forming a first insulating layer covering the first conductive layer;
   peeling the first conductive layer and the first insulating layer from the first substrate;
   attaching a second substrate to the first conductive layer and the first insulating layer;
   forming a second peeling layer comprising a silane coupling agent over a third substrate
   forming a second conductive layer over the second peeling layer;
   forming a second insulating layer covering the second conductive layer;
   peeling the second conductive layer and the second insulating layer from the third substrate;
   attaching a fourth substrate to the second conductive layer and the second insulating layer;
   forming a sealant over the second substrate or the fourth substrate;
   coating a region surrounded by the sealant with a liquid crystal material; and
   attaching the second substrate having the first conductive layer and the first insulating layer and the fourth substrate having the second conductive layer and the second insulating layer with the sealant.

2. A method for manufacturing a semiconductor device, comprising the steps of:
   forming a first peeling layer in which oxygen and silicon are combined and an inactive group is combined with the silicon over a first substrate;
   forming a first conductive layer over the first peeling layer;
   forming a first insulating layer covering the first conductive layer;
   peeling the first conductive layer and the first insulating layer from the first substrate at a portion including the first peeling layer or at a boundary between the first peeling layer and the first conductive layer;
   attaching a second substrate to the first conductive layer and the first insulating layer;
   forming a second peeling layer in which oxygen and silicon are combined and an inactive group is combined with the silicon over a third substrate;
   forming a second conductive layer over the second peeling layer;
   forming a second insulating layer covering the second conductive layer;
   peeling the second conductive layer and the second insulating layer from the third substrate at a portion including the second peeling layer or at a boundary between the second peeling layer and the second conductive layer;
   attaching a fourth substrate to the second conductive layer and the second insulating layer;
   forming a sealant over the second substrate or the fourth substrate;
   coating a region surrounded by the sealant with a liquid crystal material; and
   attaching the second substrate having the first conductive layer and the first insulating layer and the fourth substrate having the second conductive layer and the second insulating layer with the sealant.

3. A method for manufacturing a semiconductor device according to claim 1, further comprising:
   attaching a first adhesive to the first insulating layer after forming the first insulating layer.

4. A method for manufacturing a semiconductor device according to claim 2, further comprising:
   attaching a first adhesive to the first insulating layer after forming the first insulating layer.

5. A method for manufacturing a semiconductor device according to claim 1, further comprising:
   attaching a second adhesive to the second insulating layer after forming the second insulating layer.

6. A method for manufacturing a semiconductor device according to claim 2, further comprising:
   attaching a second adhesive to the second insulating layer after forming the second insulating layer.

7. A method for manufacturing a semiconductor device according to claim 2, further comprising:
   removing a remaining peeling layer after peeling the first conductive layer and the first insulating layer.

8. A method for manufacturing a semiconductor device according to claim 1, wherein the first conductive layer is a pixel electrode.

9. A method for manufacturing a semiconductor device according to claim 2, wherein the first conductive layer is a pixel electrode.

10. A method for manufacturing a semiconductor device according to claim 1, wherein the second conductive layer is an opposite electrode.

11. A method for manufacturing a semiconductor device according to claim 2, wherein the second conductive layer is an opposite electrode.

12. A method for manufacturing a semiconductor device according to claim 1, wherein the first peeling layer and the second peeling layer are formed by coating with the silane coupling agent.

13. A method for manufacturing a semiconductor device according to claim 1, wherein each of the first substrate and the third substrate is a substrate selected from the group consisting of a glass substrate, a quartz substrate, a ceramic substrate, a metal substrate and a silicon wafer.

14. A method for manufacturing a semiconductor device according to claim 2, wherein each of the first substrate and the third substrate is a substrate selected from the group consisting of a glass substrate, a quartz substrate, a ceramic substrate, a metal substrate and a silicon wafer.

15. A method for manufacturing a semiconductor device according to claim 1, wherein each of the second substrate and the fourth substrate is a flexible substrate.

16. A method for manufacturing a semiconductor device according to claim 2, wherein each of the second substrate and the fourth substrate is a flexible substrate.

* * * * *